United States Patent
Ogawa et al.

(10) Patent No.: US 12,543,402 B2
(45) Date of Patent: Feb. 3, 2026

(54) ELECTROMAGNETIC WAVE DETECTOR INCLUDING A PHOTOELECTRIC CONVERSION ELEMENT AND A PLASMON FILTER, AND ELECTROMAGNETIC WAVE DETECTOR ARRAY

(71) Applicant: Mitsubishi Electric Corporation, Tokyo (JP)

(72) Inventors: Shimpei Ogawa, Tokyo (JP); Masaaki Shimatani, Tokyo (JP); Shoichiro Fukushima, Tokyo (JP); Satoshi Okuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 456 days.

(21) Appl. No.: 18/013,572

(22) PCT Filed: May 13, 2021

(86) PCT No.: PCT/JP2021/018235
§ 371 (c)(1),
(2) Date: Dec. 29, 2022

(87) PCT Pub. No.: WO2022/044447
PCT Pub. Date: Mar. 3, 2022

(65) Prior Publication Data
US 2023/0343882 A1    Oct. 26, 2023

(30) Foreign Application Priority Data

Aug. 25, 2020    (JP) ................. 2020-141687

(51) Int. Cl.
*H10F 77/40*    (2025.01)
*G01N 21/27*    (2006.01)
(Continued)

(52) U.S. Cl.
CPC .......... *H10F 77/413* (2025.01); *G01N 21/27* (2013.01); *H10F 30/222* (2025.01); *G01N 2021/258* (2013.01)

(58) Field of Classification Search
CPC .............................. G01N 21/27; H10F 30/222
See application file for complete search history.

(56) References Cited

U.S. PATENT DOCUMENTS

2015/0243826 A1    8/2015    An et al.

FOREIGN PATENT DOCUMENTS

WO    WO-2022209647 A1 *    10/2022    ............... G02B 5/18

OTHER PUBLICATIONS

International Search Report and Written Opinion mailed on Jul. 20, 2021, received for PCT Application PCT/JP2021/018235, filed on May 13, 2021, 9 pages including English Translation.

* cited by examiner

*Primary Examiner* — Suberr L Chi
(74) *Attorney, Agent, or Firm* — XSENSUS LLP

(57) ABSTRACT

An electromagnetic wave detector includes at least one photoelectric conversion element and a plasmon filter disposed so as to be opposite to the at least one photoelectric conversion element. A plurality of through-holes are periodically made in the plasmon filter. The at least one photoelectric conversion element includes a semiconductor layer including a region overlapping with at least one through-hole in the plurality of through-holes in planar view, an insulating layer formed so as to cover a part of the region, a two-dimensional material layer that is disposed on the other portion of the region and the insulating layer and electrically connected to the other portion of the region, a first electrode portion electrically connected to the two- (Continued)

dimensional material layer, and a second electrode portion electrically connected to the semiconductor layer.

26 Claims, 14 Drawing Sheets

(51) Int. Cl.
*H10F 30/222* (2025.01)
*G01N 21/25* (2006.01)

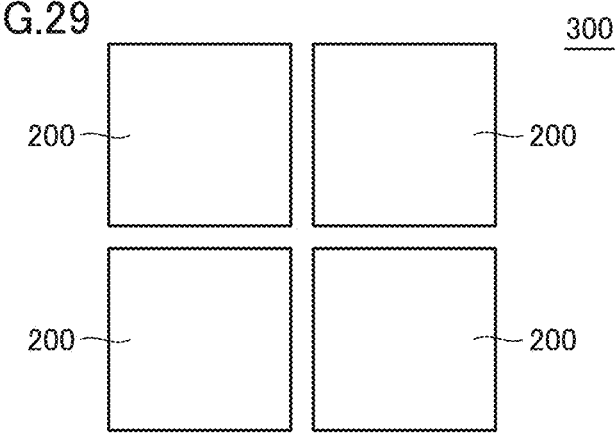
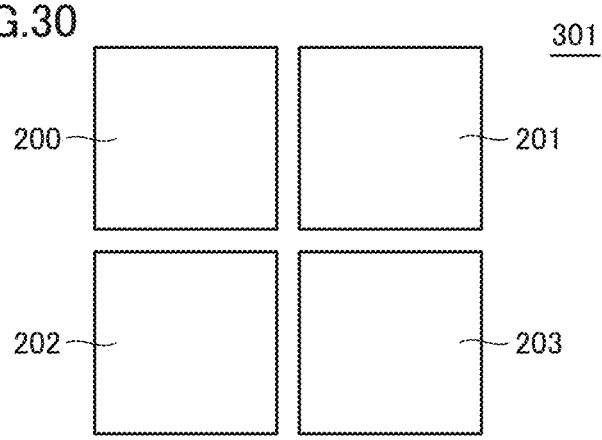

ELECTROMAGNETIC WAVE DETECTOR INCLUDING A PHOTOELECTRIC CONVERSION ELEMENT AND A PLASMON FILTER, AND ELECTROMAGNETIC WAVE DETECTOR ARRAY

CROSS-REFERENCE TO RELATED APPLICATIONS

The present application is based on PCT filing PCT/JP2021/018235, filed May 13, 2021, which claims priority to JP 2020-141687, filed Aug. 25, 2020, the entire contents of each are incorporated herein by reference.

TECHNICAL FIELD

The present disclosure relates to an electromagnetic wave detector and an electromagnetic wave detector array.

BACKGROUND ART

Conventionally, graphene having extremely high mobility, which is an example of a two-dimensional material layer, is known as a material of an electromagnetic wave detection layer used in a next-generation electromagnetic wave detector. Absorptivity of graphene is as low as 2.3%. For this reason, a method for increasing sensitivity in the electromagnetic wave detector using the graphene has been proposed. For example, US 2015/0243826 A (PTL 1) proposes a detector having the following structure. That is, in the detector of PTL 1, at least two dielectric layers are provided on an n-type semiconductor layer. A graphene layer is formed on the two dielectric layers and on a surface portion of the n-type semiconductor layer located between the two dielectric layers. The graphene layer and the n-type semiconductor layer are joined to form a Schottky junction. A source-drain electrode connected to both ends of the graphene layer is disposed on the dielectric layer. A gate electrode is connected to the n-type semiconductor layer. When voltage is applied between the gate electrode and the source electrode or the drain electrode, the Schottky junction enables an OFF operation.

CITATION LIST

Patent Literature

PTL 1: US Patent No. 2015/0243826 A

SUMMARY OF INVENTION

Technical Problem

The conventional detector described above is sensitive to an electromagnetic wave having energy greater than or equal to a band gap of the semiconductor layer in contact with the graphene layer. In other words, the detection wavelength of the detector is less than or equal to the wavelength corresponding to the band gap of the semiconductor layer. Accordingly, it is difficult for the detector to selectively detect only the electromagnetic wave in a specific wavelength band.

In the detector, the sensitivity of the detector during the Schottky operation in which the voltage is applied to the gate electrode and the source electrode or the drain electrode depends on quantum efficiency of the semiconductor layer, so that it is difficult to increase the sensitivity of the detector.

A main object of the present disclosure is to provide an electromagnetic wave detector and an electromagnetic wave detector array capable of selectively detecting only the electromagnetic wave in the specific wavelength band and having high detection sensitivity as compared with the conventional detector described above.

Solution to Problem

An electromagnetic wave detector according to the present disclosure includes at least one photoelectric conversion element and a plasmon filter disposed so as to be opposite to the at least one photoelectric conversion element. A plurality of through-holes are periodically made in the plasmon filter. The at least one photoelectric conversion element includes a semiconductor layer including a region overlapping with at least one through-hole in the plurality of through-holes in planar view, an insulating layer formed so as to cover a part of the region, a two-dimensional material layer that is disposed on the other portion of the region and the insulating layer and electrically connected to the other portion of the region, a first electrode portion electrically connected to the two-dimensional material layer, and a second electrode portion electrically connected to the semiconductor layer.

Advantageous Effects of Invention

According to the present disclosure, the electromagnetic wave detector and the electromagnetic wave detector array capable of selectively detecting only the electromagnetic wave in the specific wavelength band and having high detection sensitivity as compared with the above-described conventional detector can be provided.

BRIEF DESCRIPTION OF DRAWINGS

FIG. 29 is a plan view illustrating an electromagnetic wave detector array according to a twenty-first embodiment.

FIG. 30 is a plan view illustrating a modification of the electromagnetic wave detector of the twenty-first embodiment.

DESCRIPTION OF EMBODIMENTS

Figure 1:
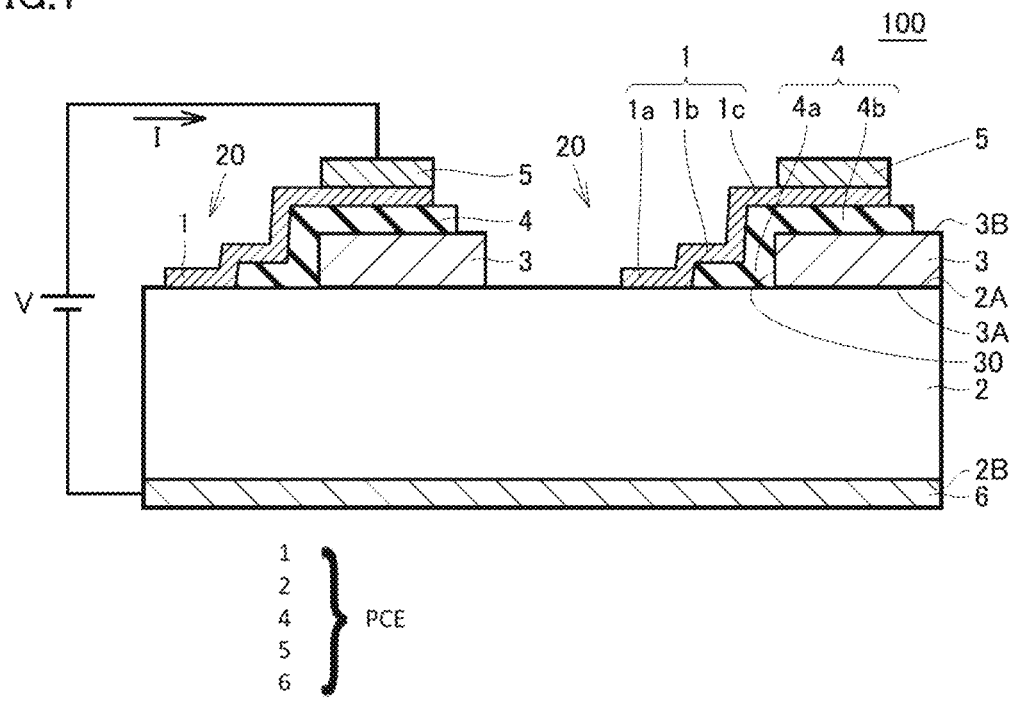
FIG. 1 is a sectional view illustrating an electromagnetic wave detector according to a first embodiment.

Hereinafter, embodiments of the present disclosure will be described with reference to the drawings. The drawings are schematic, and conceptually illustrate functions or structures. The present disclosure is not limited to the following embodiments. A basic configuration of an electromagnetic wave detector is common to all the embodiments, unless otherwise specified. In addition, the components denoted by the same reference numerals are the same as or corresponding to them as described above. This is common in the entire specification.

The wavelength band detected by the electromagnetic wave detector of the embodiment is not particularly limited. For example, the electromagnetic wave detector of the embodiment is a detector that detects the electromagnetic wave such as visible light, infrared light, near infrared light, ultraviolet light, X-rays, terahertz (THz) waves, or microwaves. In the embodiments of the invention, these light and radio waves are collectively referred to as the electromagnetic wave. In addition, an arbitrary wavelength within a wavelength band to be detected by the electromagnetic wave detector of the embodiment is referred to as the detection wavelength.

In addition, the electromagnetic wave detector of the embodiment may be provided to detect only the electromagnetic wave in one wavelength band, or provided to detect the electromagnetic waves in a plurality of different wavelength bands. In other words, the detection wavelength of the electromagnetic wave detector of the embodiment may be only one detection wavelength or a plurality of detection wavelengths.

In the embodiment, a term of p-type graphene or n-type graphene is used as graphene that is an example of a two-dimensional material layer, but graphene having more holes than graphene in an intrinsic state is referred to as a p-type, and graphene having more electrons is referred to as an n-type.

In the embodiment, the terms of n-type or p-type are used for the material of the contact layer provided on the graphene that is an example of the two-dimensional material layer, and for example, these terms indicate the material having an electron donating property in the case of the n-type and the material having an electron withdrawing property in the case of the p-type. In addition, there is the case where a charge bias is observed in the entire molecule, the case where electrons are dominant is referred to as the n-type, and the case where holes are dominant is referred to as the p-type. Any one of an organic substance and an inorganic substance or a mixture thereof can be used as these materials of contact layers.

A plasmon resonance phenomenon such as a surface plasmon resonance phenomenon, which is an interaction between a metal surface and light, a phenomenon called pseudo surface plasmon resonance in the sense of resonance applied to the metal surface in a region other than the visible light region and the near-infrared light region, or a phenomenon called metamaterial or plasmonic metamaterial in the sense of manipulating a specific wavelength by a structure having a dimension less than or equal to a wavelength are not particularly distinguished by names, and are treated equally in terms of an effect exerted by the phenomenon. Here, these resonances are referred to as surface plasmon resonance, plasmon resonance, or simply resonance.

In addition, the surface plasmon resonance is generally expressed as a phenomenon in which the electromagnetic wave propagates or is localized at an interface between a metal and a dielectric. However, in recent years, it has been found that the surface plasmon resonance is also generated in, for example, titanium oxide and graphene other than metal materials. In the embodiment, the material in which the surface plasmon resonance is generated (surface plasmon is resonantly excited) when the electromagnetic wave having the detection wavelength is incident is referred to as a plasmon resonance material without distinguishing such materials. In the embodiment, the material constituting at least a part of a surface of a plasmon filter includes a plasmon resonance material.

During an operation of the electromagnetic wave detector of the embodiment, a layer in which a tunnel current is not generated is referred to as an insulating layer, and a layer in which a tunnel current can be generated is referred to as a buffer layer.

In addition, in the embodiment, the material constituting the two-dimensional material layer may be any material in which atoms can be arranged in a single layer in a two-dimensional plane, and for example, include at least one selected from the group consisting of graphene, transition metal dichalcogenide (TMD), black phosphorus, silicene (two-dimensional honeycomb structure by silicon atoms), and germanene (two-dimensional honeycomb structure by germanium atoms). Examples of the transition metal dichalcogenide include molybdenum disulfide ($MoS_2$), tungsten disulfide ($WS_2$), and tungsten diselenide ($WSe_2$). The two-dimensional material layer constructed of at least one of the above materials basically has the same effect as the two-dimensional material layer constructed of graphene described later.

FIRST EMBODIMENT

Figure 2:
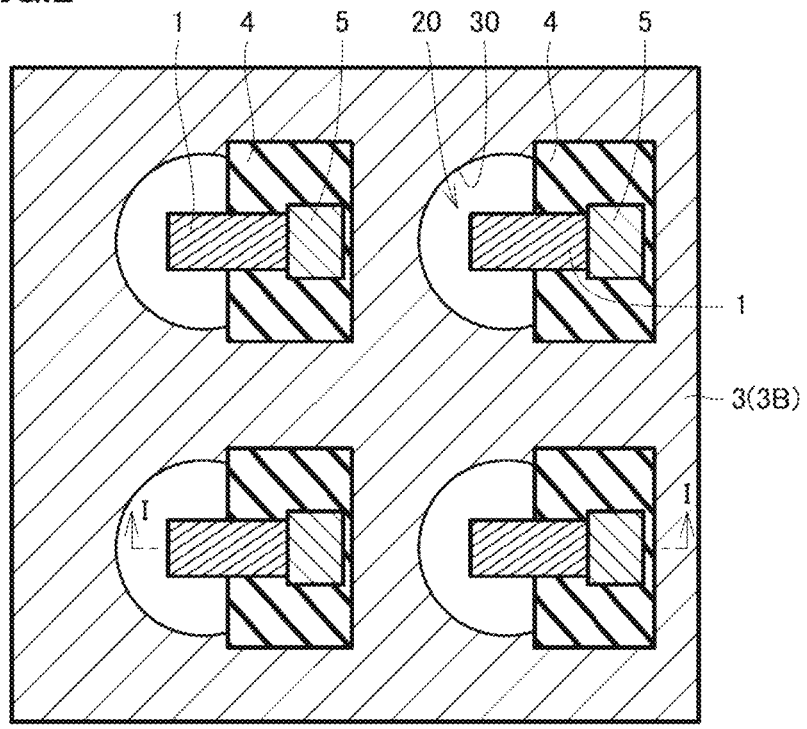
FIG. 2 is a plan view of the electromagnetic wave detector in FIG. 1.

As illustrated in FIGS. 1 and 2, an electromagnetic wave detector 100 according to a first embodiment includes a plurality of photoelectric conversion elements PCE and a plasmon filter 3. Each photoelectric conversion element PCE mainly includes a two-dimensional material layer 1, a semiconductor layer 2, an insulating layer 4, a first electrode portion 5, and a second electrode portion 6. Each photoelectric conversion element PCE can constitute one pixel. Two-dimensional material layer 1 and first electrode portion 5 of each photoelectric conversion element PCE are provided separately from another photoelectric conversion element PCE. Semiconductor layer 2 and second electrode portion 6 of each photoelectric conversion element PCE are provided integrally with semiconductor layer 2 and second electrode portion 6 of another photoelectric conversion element. For example, insulating layer 4 of each photoelectric conversion element PCE is provided separately from insulating layer 4 of another photoelectric conversion element PCE. For example, insulating layer 4 of each photoelectric conversion element PCE may be provided integrally with insulating layer 4 of another photoelectric conversion element PCE.

Plasmon filter 3 is disposed so as to be opposite to each of the plurality of photoelectric conversion elements PCE. Plasmon filter 3 has a third surface 3A opposite to a first surface 2A of semiconductor layer 2 described later and a fourth surface 3B located on an opposite side of third surface 3A. For example, third surface 3A is in contact with first surface 2A of semiconductor layer 2. Fourth surface 3B is in contact with insulating layer 4.

Plasmon filter 3 is provided so as to transmit only an electromagnetic wave in a wavelength band to be detected by electromagnetic wave detector 100 from a side of fourth surface 3B to a side of third surface 3A (aside of semiconductor layer 2). In other words, plasmon filter 3 is provided such that the surface plasmon resonance is generated when the electromagnetic wave having a detection wavelength is incident. A common wavelength range exists between the wavelength band in which the surface plasmon is excited in plasmon filter 3 and the wavelength band in which semiconductor layer 2 has sensitivity. In general, the wavelength band in which the surface plasmon is excited is assumed to be narrower than the wavelength band in which semiconductor layer 2 has the sensitivity. However, as described later, when the wavelength band in which the surface plasmon is excited is widened, the present invention is not limited thereto in some cases.

Figure 3:
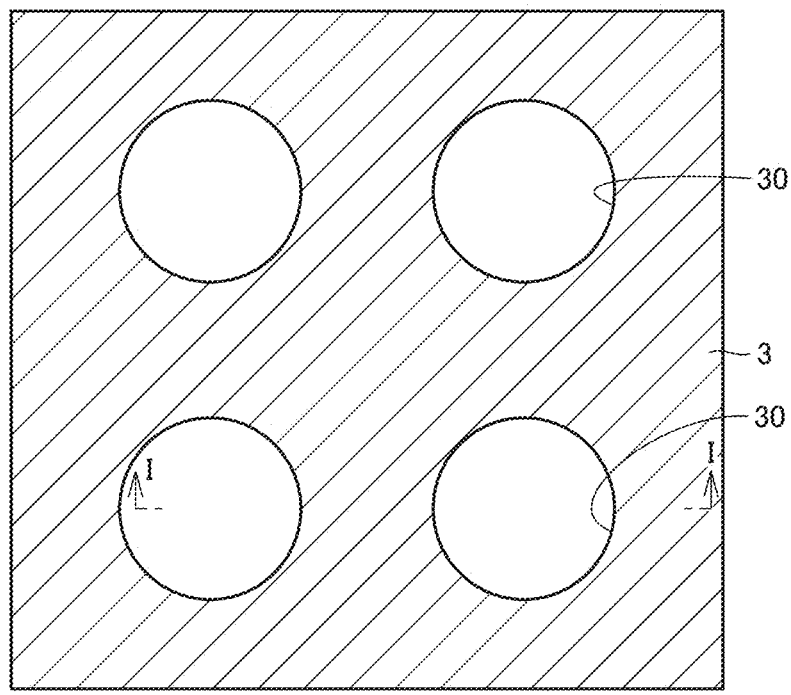
FIG. 3 is a plan view of a plasmon filter of the electromagnetic wave detector in FIG. 1.

As illustrated in FIGS. 1 to 3, a plurality of through-holes 30 penetrating from third surface 3A to fourth surface 3B is formed in plasmon filter 3. For example, the number of through-holes 30 is at least 3. For example, the plurality of through-holes 30 are periodically arranged in two directions that are along third surface 3A and intersect with each other. The periodic arrangement indicates that units including at least two through-holes 30 are periodically arranged. For example, the plurality of through-holes 30 are arranged at equal intervals. The units including at least three through-holes 30 may be periodically arranged. In addition, the plurality of through-holes 30 may be periodically arranged at intervals in at least one direction along third surface 3A.

For example, the material constituting the entire surface of plasmon filter 3 includes the above-described plasmon resonance material. The material constituting at least a part of the surface of plasmon filter 3 may include a plasmon resonance material. For example, only the material constituting at least fourth surface 3B of plasmon filter 3 and the inner peripheral surface of each of the plurality of through-holes 30 includes the plasmon resonance material.

An opening width and a depth (a thickness of plasmon filter 3) of each of the plurality of through-holes 30, an interval P (period, see FIG. 3) between a central axes C of two adjacent through-holes 30, and the plasmon resonance material can be arbitrarily selected according to the detection wavelength such that the surface plasmon resonance is generated in plasmon filter 3 when the electromagnetic wave having the detection wavelength is incident. For example, an opening width of each through-hole 30 is shorter than the detection wavelength.

The planar shape of the plurality of through-holes 30 may be any shape as long as the surface plasmon resonance is generated in plasmon filter 3 when the electromagnetic wave having the detection wavelength is incident, and for example, is a circular shape as illustrated in FIG. 3. For example, the planar shape of the plurality of through-holes 30 may be a square, a rectangle, an ellipse, a triangle, a bullseye shape (a shape consisting of one ring or ring and concentric rings arranged around the ring or ring), a fractal shape, or a cross shape. When the planar shape of the plurality of through-holes 30 is the cross shape, the surface plasmon resonance is generated when plasmon filter 3 is irradiated with each of at least two electromagnetic waves having different detection wavelengths. The planar shapes of the plurality of through-holes 30 may be different from each other. The plurality of through-holes 30 may have a first through-hole and a second through-hole having the same planar shape as the first through-hole but having a different size from the first through-hole.

Semiconductor layer 2 has a first surface 2A and a second surface 213 located on a side opposite to first surface 2A. As illustrated in FIGS. 1 and 2, two-dimensional material layer 1, plasmon filter 3, insulating layer 4, and first electrode portion 5 are disposed on first surface 2A of semiconductor layer 2. Second electrode portion 6 is disposed on the second surface 21B of semiconductor layer 2. Electromagnetic wave detector 100 detects the electromagnetic wave incident on semiconductor layer 2 from the side where plasmon filter 3 is disposed.

Semiconductor layer 2 has a plurality of regions 20 overlapping with the plurality of through-holes 30 in planar view. Each region 20 is a columnar region including first surface 2A and second surface 2B. First surface 2A in a region other than the plurality of regions 20 is in contact with third surface 3A of plasmon filter 3. First surface 2A of each region 20 has a first contact region in contact with the first part of later-described two-dimensional material layer 1, a second contact region in contact with a part of insulating layer 4, and a region exposed from two-dimensional material layer 1, plasmon filter 3, and insulating layer 4 in planar view. The entire surface of second surface 23 is in contact with second electrode portion 6.

Semiconductor layer 2 has sensitivity to a detection wavelength. That is, semiconductor layer 2 is provided such that photocarriers are generated in semiconductor layer 2 when the electromagnetic wave having the detection wavelength is incident on semiconductor layer 2. As described above, the common wavelength range exists between the wavelength band in which semiconductor layer 2 has sensitivity and the wavelength band in which the surface plasmon is excited in plasmon filter 3.

The semiconductor material constituting semiconductor layer 2 can be arbitrarily selected according to the detection wavelength. The material constituting semiconductor layer 2 may be any semiconductor material, and for example, includes any semiconductor material of group TV, any compound semiconductor material of group III-V. or any compound semiconductor material of group II-VI. For example, the material constituting semiconductor layer 2 may include at least one selected from the group consisting of silicon (Si), germanium (Ge), mercury cadmium tellurium (HgCddTe), indium antimonide (InSb), lead selenium (PbSe), lead sulfur (PhS), cadmium sulfur (CdS), gallium nitride (GaN), silicon carbide (SiC), gallium phosphide (GaP), indium gallium arsenide (InGaAs), gallium arsenide (GaAs), and indium arsenide (InAs). Semiconductor layer 2 may have at least one of a quantum well and a quantum dot, or have a superlattice (for example, a type II superlattice) in which such a quantum structure is periodically arranged. Semiconductor layer 2 may have a pn junction.

When electromagnetic wave detector 100 has a plurality of detection wavelengths, semiconductor layer 2 is configured as an aggregate of a plurality of semiconductor layers having sensitivity to the detection wavelengths different from each other.

Preferably, semiconductor layer 2 is doped with impurities such that the electric resistivity of semiconductor layer 2 is less than or equal to 100 Ω·cm. A moving speed treading speed) of a carrier in semiconductor layer 2 increases by doping semiconductor layer 2 with a high concentration. As a result, a response speed of the electromagnetic wave detector is improved.

Insulating layer 4 is formed so as to cover a part (second contact region) of first surface 2A of region 20. Insulating layer 4 extends from the second contact region to apart of fourth surface 3B of plasmon filter 3. In other words, insulating layer 4 has a part 4a disposed on the second contact region and a part 4b disposed on plasmon filter 3. Part 4a of insulating layer 4 is in contact with the second contact region, a part of the inner peripheral surface of through-hole 30 of plasmon filter 3, and a second part 1b of later-described two-dimensional material layer 1. Part 4b of insulating layer 4 is in contact with a third part 1c of later-described two-dimensional material layer 1 and a part of fourth surface 3B of plasmon filter 3. Part 4b is connected to an upper end of part 4a. As illustrated in FIG. 1, insulating layer 4 is formed stepwise.

Insulating layer 4 electrically insulates semiconductor layer 2 from a second part of two-dimensional material layer 1 and first electrode portion 5. The thickness of insulating layer 4 is not particularly limited as long as no tunnel current is generated between the second part of two-dimensional material layer 1 and first electrode portion 5 and semiconductor layer 2 during the operation of electromagnetic wave detector 100. Preferably, the thickness of insulating layer 4 is as thin as possible from the viewpoint of enhancing a later-described optical gate effect.

For example, an insulating film made of silicon oxide can be used as insulating layer 4. The material constituting insulating layer 4 may be any insulating material having an electrical insulation property, and is not limited to the above-described silicon oxide. For example, the material constituting insulating layer 4 may contain at least one selected from the group consisting of silicon oxide, tetraethyl orthosilicate, silicon nitride, hafnium oxide, aluminum oxide, nickel oxide, boron nitride, and a siloxane-based polymer material. For example, because boron nitride has an atomic arrangement similar to that of graphene, boron nitride does not adversely affect mobility of a charge even when boron nitride comes into contact with two-dimensional material layer 1 made of the graphene. For this reason, boron nitride is suitable as a material constituting insulating layer 4 from the viewpoint of preventing insulating layer 4 from inhibiting performance of two-dimensional material layer 1 such as electron mobility.

Two-dimensional material layer 1 extends from the first contact region of region 20 onto insulating layer 4 disposed on plasmon filter 3. Two-dimensional material layer 1 has a first part 1a disposed on the other part (first contact region) of first surface 2A of region 20, second part 1b disposed on part 4a of insulating layer 4, and third part 1c disposed on part 4b of plasmon filter 3 and insulating layer 4. First part 1a of two-dimensional material layer 1 is disposed on region 20 without insulating layer 4 interposed therebetween. For example, first part 1a is electrically connected to the first contact region of semiconductor layer 2. Preferably, first part 1a forms a Schottky junction with semiconductor layer 2. Second part 1b is provided such that an electric field effect is given by photocarriers generated in semiconductor layer 2. First part 1a and third part 1c act as source-drain regions in the later-described optical gate effect. Second part 1b acts as a channel region in the later-described optical gate effect.

As illustrated in FIG. 1, two-dimensional material layer 1 is formed stepwise. For example, the number of steps of two-dimensional material layer 1 is two, which is one more than the number of steps of insulating layer 4. First part 1a of two-dimensional material layer 1 has one end in a longitudinal direction of two-dimensional material layer 1. Third part 1c of two-dimensional material layer 1 has the other end in the longitudinal direction of two-dimensional material layer 1.

For example, single-layer graphene can be used as two-dimensional material layer 1. The single-layer graphene is a monatomic layer of a two-dimensional carbon crystal. The single-layer graphene has carbon atoms in each chain arranged in a hexagonal shape. Two-dimensional material layer 1 may be configured as multilayer graphene in which at least two layers of single-layer graphene are laminated. Non-doped graphene or graphene doped with p-type or n-type impurities may be used as two-dimensional material layer 1.

When the multilayered graphene is used for two-dimensional material layer 1, photoelectric conversion efficiency of two-dimensional material layer 1 increases, and the sensitivity of the electromagnetic wave detector increases. In the multilayered graphene used as two-dimensional material layer 1, the direction of a lattice vector of a hexagonal lattice in arbitrary two layers of graphene may not coincide or may coincide. For example, a band gap is formed in two-dimensional material layer 1 by laminating at least two layers of graphene. As a result, a wavelength selection effect of the electromagnetic wave to be photoelectrically converted can be provided. When the number of layers in the multilayered graphene constituting two-dimensional material layer 1 increases, the mobility of the carrier in the channel region decreases. On the other hand, in this case, two-dimensional material layer 1 is less likely to be affected by carrier scattering from an underlying structure such as a substrate, and as a result, a noise level decreases. Therefore, in the electromagnetic wave detector using the multilayered graphene as two-dimensional material layer 1, the light absorption increases, and the detection sensitivity of the electromagnetic wave can be enhanced.

When two-dimensional material layer 1 is in contact with first electrode portion 5, the carrier is doped from first electrode portion 5 to two-dimensional material layer 1. For example, when gold (Au) is used as the material of first electrode portion 5, a hole is doped in two-dimensional material layer 1 near first electrode portion 5 due to a difference in work function between two-dimensional material layer 1 and Au. When the electromagnetic wave detector is driven in the electron conduction state in this state, the mobility of the electron flowing in the channel region of two-dimensional material layer 1 decreases due to the influence of the hole doped in two-dimensional material layer 1 from first electrode portion 5, and the contact resistance between two-dimensional material layer 1 and first electrode portion 5 increases. Due to the increase in the contact resistance, the mobility of the electron (carrier) due to the electric field effect in the electromagnetic wave detector decreases, and the performance of the electromagnetic wave detector may decrease. In particular, when the single-layer graphene is used as two-dimensional material layer 1, the doping amount of the carrier injected from first electrode portion 5 is large. For this reason, the decrease in the electron mobility in the electromagnetic wave detector is particularly remarkable when the single-layer graphene is used as two-dimensional material layer 1. Accordingly, when all two-dimensional material layers 1 are formed of the single-layer graphene, the performance of the electromagnetic wave detector may be degraded.

Therefore, first part 1a of two-dimensional material layer 1 that is easily doped with the carrier from first electrode portion 5 may be made of multilayer graphene. The multilayer graphene has smaller carrier doping from first electrode portion 5 than the single layer graphene. Consequently, an increase in contact resistance between two-dimensional material layer 1 and first electrode portion 5 can be prevented. As a result, the above-described decrease in electron mobility in the electromagnetic wave detector can be prevented and the performance of the electromagnetic wave detector can be improved. In this case, second part 1b of two-dimensional material layer 1 may be made of single-layer graphene. That is, in two-dimensional material layer 1, first part 1a and third part 1c that can act as the source-drain regions may be made of multilayer graphene, and second part 1b that can act as the channel region may be made of single layer graphene. In this way, the mobility is higher as compared with the case where entire two-dimensional material layer 1 is formed of the single layer graphene, and the mobility of the channel region is higher as compared with the case where entire two-dimensional material layer 1 is formed of the multilayer graphene, so that the performance of electromagnetic wave detector 100 is improved.

Nanoribbon shaped graphene (hereinafter, also referred to as graphene nanoribbons) can also be used as two-dimensional material layer 1. In this case, for example, any of a graphene nanoribbon simple substance, a composite obtained by laminating a plurality of graphene nanoribbons, or a structure in which graphene nanoribbons are periodically arranged on a plane can be used as two-dimensional material layer 1. For example, when a structure in which graphene nanoribbons are periodically arranged is used as two-dimensional material layer 1, the plasmon resonance can be generated in the graphene nanoribbons. As a result, the sensitivity of the electromagnetic wave detector can be improved. At this point, the structure in which the graphene nanoribbons are periodically arranged is sometimes referred to as graphene metamaterial. Accordingly, the above-described effect can also be obtained in the electromagnetic wave detector using the graphene metamaterial as two-dimensional material layer 1.

First electrode portion 5 is disposed on part 4b of insulating layer 4, and electrically connected to third part 1c of two-dimensional material layer 1. For example, first electrode portion 5 is disposed on third part 1c of two-dimensional material layer 1. In planar view, first electrode portion 5 is disposed so as to overlap with plasmon filter 3, part 4b of insulating layer 4, and third part 1c of two-dimensional material layer 1. In planar view, for example, first electrode portion 5 is not disposed so as to overlap with region 20. Second electrode portion 6 is disposed on the second surface 2B of semiconductor layer 2.

As the material constituting first electrode portion 5 and second electrode portion 6, any material can be used as long as it is a conductor. For example, the material constituting first electrode portion 5 and second electrode portion 6 contains at least one selected from the group consisting of gold (Au), silver (Ag), copper (Cu), aluminum (Al), nickel (Ni), chromium (Cr), and palladium (Pd).

An adhesion layer (not illustrated) may be formed between second electrode portion 6 and semiconductor layer 2. The adhesion layer enhances adhesion between second electrode portion 6 and semiconductor layer 2. For example, the material constituting the adhesion layer contains at least one of chromium (Cr) and titanium (Ti).

The relative positional relationship between third part 1e of two-dimensional material layer 1 and first electrode portion 5 is not particularly limited as long as they are electrically connected to each other on part 4b of insulating layer 4. For example, first electrode portion 5 may be disposed on insulating layer 4 and below third part 1c of two-dimensional material layer 1. In this case, the adhesion layer may be formed between first electrode portion 5 and insulating layer 4. The adhesion layer enhances the adhesion between first electrode portion 5 and insulating layer 4. For example, the material constituting the adhesion layer contains at least one of Cr and Ti.

A protective film (not illustrated) may be formed on two-dimensional material layer 1. The protective film may be provided so as to cover the periphery of two-dimensional material layer 1, semiconductor layer 2, and first electrode portion 5. Any material can be used as the material constituting the protective film, and for example, an insulating film made of silicon oxide can be used as the protective film. An insulator such as an oxide or a nitride, for example, silicon oxide, silicon nitride, hafnium oxide, aluminum oxide, boron nitride, or the like may be used as a material constituting the protective film. The protective film may be formed so as to embed through-hole 30. In this case, the plasmon resonance wavelength changes due to the effect of the refractive index of the protective film, but the wavelength selectivity does not change.

In electromagnetic wave detector 100, each through-hole 30 can be regarded as one detection unit, and in this case, the number of photoelectric conversion elements PCE is equal to the number of through-holes 30. Therefore, electromagnetic wave detector 100 can constitute an image sensor by appropriately reading a signal from each photoelectric conversion element PCE. For example, the signal reading method may be a method generally used in a conventional image sensor.

The interval between the centers of two adjacent through-holes 30 may not be constant. In this case, the wavelength (resonance wavelength) of the electromagnetic wave that can be transmitted by plasmon filter 3 is set to a plurality of wavelengths or a wide band. The plurality of through-holes 30 may include a first through-hole group adjacent to each other with a first interval and a second through-hole group adjacent to each other with a second interval different from the first interval.

<Method for Manufacturing Electromagnetic Wave Detector>

First, semiconductor layer 2 is prepared. For example, semiconductor layer 2 is prepared as a flat substrate made of silicon.

Subsequently, second electrode portion 6 is formed on second surface 2B of semiconductor layer 2. Specifically, first a protective film is formed on the first surface 2A of semiconductor layer 2. For example, a resist is used as the protective film. In this state, second electrode portion 6 is formed on second surface 2B of semiconductor layer 2. At this point, in order to improve the adhesion between semiconductor layer 2 and second electrode portion 6, the adhesion layer may be formed on the back surface of semiconductor layer 2 prior to second electrode portion 6. This process may be performed after each later-described process as long as the structure on first surface 2A of semiconductor layer 2 can be protected. After this process, the protective film formed on first surface 2A is removed.

Subsequently, plasmon filter 3 is formed on first surface 2A of semiconductor layer 2. In an example of the process, first the plasmon resonance material is deposited on first surface 2A. The film forming method is not particularly limited, but for example, is a sputtering method or a vapor deposition method. Subsequently, a resist mask is formed on the film made of the plasmon resonance material using photolithography, EB drawing, or the like. The resist mask is formed so as to expose only a region of the film where the plurality of through-holes 30 are to be made and to cover other regions. Thereafter, the film is partially removed using the resist mask as a mask by wet etching or dry etching. As a result, a part of the film remains under the resist mask. The pat of the film becomes plasmon filter 3. Thereafter, the resist mask is removed. Plasmon filter 3 is formed in this manner. At the same time, a plurality of regions 20 overlapping with the plurality of through-holes 30 in planar view are formed in semiconductor layer 2.

In another example of the process, first the resist mask is formed on first surface 2A of semiconductor layer 2 using photolithography, EB drawing, or the like. In the resist mask, only regions (in other words, the region where plasmon filter 3 is to be formed) other than the plurality of regions 20 in semiconductor layer 2 are exposed, and the resist mask is formed to cover the plurality of regions 20 (in other words, the region where the plurality of through-holes 30 are to be formed). Thereafter, the plasmon resonance material is deposited on the resist mask. The film forming method is also not particularly limited, and for example, is a sputtering method or a vapor deposition method. At this time, the film is formed so as to extend from the inside of an opening of the resist mask to the upper surface of the resist mask. Thereafter, another part of the film disposed in the opening of the resist mask remains on the plurality of regions 20 of semiconductor layer 2 by removing the resist mask together with a part of the film, and becomes plasmon filter 3. The above-described method is generally called lift-off.

Subsequently, insulating layer 4 is formed on first surface 2A of semiconductor layer 2 and fourth surface 3B of plasmon filter 3. Specifically, first, an insulating film to be insulating layer 4 is formed on first surface 2A of semiconductor layer 2 and fourth surface 3B of plasmon filter 3. The film forming method is not particularly limited. For example, when the material constituting semiconductor layer 2 is silicon and when the material constituting insulating layer 4 is silicon oxide ($SiO_2$), a part of region 20 of semiconductor layer 2 may be partially thermally oxidized. The film forming method may be a chemical vapor deposition (CVD) method or a sputtering method. Subsequently, the resist mask is formed on the insulating film to be insulating layer 4 using photolithography, EB drawing, or the like. The resist mask is formed so as to cover only the region of the insulating film where insulating layer 4 is to be formed and to expose other regions. Thereafter, the insulating film is partially removed using the resist mask as a mask by wet etching or dry etching. As a result, a part of the insulating film remains under the resist mask. A part of the insulating film serves as insulating layer 4. Thereafter, the resist mask is removed. In this way, insulating layer 4 is formed. Insulating layer 4 has part 4a disposed on the second contact region of region 20 and part 4b disposed on fourth surface 3B of plasmon filter 3.

Subsequently, two-dimensional material layer 1 is formed on the first contact region of each region 20 and insulating layer 4. Specifically, first a two-dimensional material film to be two-dimensional material layer 1 is formed on first surface 2A. The film forming method is not particularly limited, but for example, is an epitaxial growth method. In addition, the previously-formed two-dimensional material film by a CVD method or the like may be transferred and bonded onto first surface 2A. When the material constituting two-dimensional material layer 1 contains graphene, graphene peeled off from highly oriented pyrolytic graphite (HOPG) by a mechanical peeling method may be transferred and bonded onto first surface 2A. Subsequently, the resist mask is formed on two-dimensional material layer using photolithography or the like. The resist mask, is formed so as to cover only the region of the two-dimensional material fin where two-dimensional material layer 1 is to be formed. Thereafter, two-dimensional material layer is partially removed by etching with oxygen plasma using the resist mask as a mask. As a result, a part of the two-dimensional material film remains under the resist mask. A part of the two-dimensional material film becomes two-dimensional material layer 1. Thereafter, the resist mask is removed. In this way, two-dimensional material layer 1 is formed. Two-dimensional material layer t includes first part 1a, second part 1b, and third part 1c.

Subsequently, first electrode portion 5 is formed. In one example of this process, first electrode portion 5 is formed by the above-described lift-off method. First, the resist mask is formed on first surface 2A by photolithography, EB drawing, or the like. In the resist mask, the opening is formed in a region where first electrode portion 5 is to be formed. Thereafter, a film of metal or the like to be first electrode portion 5 is formed on the resist mask. The film can be formed by a vapor deposition method, a sputtering method, or the like. At this time, the film is formed so as to extend from the inside of an opening of the resist mask to the upper surface of the resist mask. Thereafter, by removing the resist mask together with a part of the film, another part of the film arranged in the opening of the resist mask remains on third part 1c of two-dimensional material layer 1 and becomes first electrode portion 5.

In another example of this process, the film such as a metal film to be first electrode portion 5 is first formed on first surface 2A. Thereafter, the resist mask is formed on the film by a photolithography method. The resist mask is formed so as to cover the region where first electrode portion 5 is to be formed, but is not formed in a region other than the region where first electrode portion 5 is to be formed. Thereafter, the film is partially removed using the resist mask as a mask by wet etching or dry etching. As a result, a part of the film remains under the resist mask. A part of the film becomes first electrode portion 5. Thereafter, the resist mask is removed. In this manner, first electrode portion 5 may be formed.

In this process, preferably the protective film for protecting first part 1a and second part 1b of two-dimensional material layer 1 is formed before the film to be first electrode portion 5 is formed. Process damage applied to first part 1a and second part 1b at the time of film formation can be reduced by forming the protective film before film formation.

The electromagnetic wave detector 100 in FIGS. 1 and 2 is obtained through the above processes.

<Operating Principle of Electromagnetic Wave Detector>

An operation principle of the electromagnetic wave detector of the first embodiment will be described below.

First, as illustrated in FIG. 1, a power supply circuit that applies voltage V is electrically connected between first electrode portion 5 and second electrode portion 6, and first electrode portion 5, two-dimensional material layer 1, semiconductor layer 2, and second electrode portion 6 are electrically connected in this order. Subsequently, voltage V is applied between first electrode portion 5 and second electrode portion 6. Preferably, voltage V is set to be reverse bias with respect to the Schottky junction between two-dimensional material layer 1 and semiconductor layer 2. When voltage V is applied, current I flows through two-dimensional material layer 1 that becomes a part of the current path between first electrode portion 5 and second electrode portion 6. An ammeter (not illustrated) is installed in the power supply circuit, and current I flowing through two-dimensional material layer 1 is monitored by the ammeter.

Subsequently, when electromagnetic wave detector 100 is irradiated with the electromagnetic wave having the detection wavelength from the side of plasmon filter 3, surface plasmon resonance is generated in plasmon filter 3. When surface plasmon resonance is generated, the electromagnetic field at the resonance wavelength is enhanced, thereby enhancing the transmittance. The transmittance can reach almost 100%. Furthermore, in the region where the outer peripheral edge of each through-hole 30 of plasmon filter 3 and first surface 2A of semiconductor layer 2 are in contact with each other, the electromagnetic field is enhanced several times to at least several tens of times as compared with the case where the incident electromagnetic field is 1. As described above, the electromagnetic field is enhanced in the peripheral region of the contact interface between semiconductor layer 2 and plasmon filter 3, so that the quantum efficiency in semiconductor layer 2 is improved.

As a result, only the electromagnetic wave having the detection wavelength is selectively incident on semiconductor layer 2 by plasmon filter 3, and the quantum efficiency in semiconductor layer 2 is increased, so that a large number of photocarriers (electron-hole pairs) are generated in semiconductor layer 2 by photoelectric conversion.

The photocarriers receive voltage V and are injected into first part 1a of two-dimensional material layer 1, causing the change in current I. A current component that causes the change in current I due to electromagnetic wave irradiation is referred to as a photocurrent. Furthermore, the photocarriers generated in semiconductor layer 2 impart an electric field effect to second part 1b of two-dimensional material layer 1 through part 4a of insulating layer 4. As a result, a resistance value of second part 1b of two-dimensional material layer 1 changes, and current I flowing through two-dimensional material layer 1 changes. This effect is referred to as the optical gate effect.

In electromagnetic wave detector 100, the photocurrent is amplified by the optical gate effect, so that current I changes relatively largely. By detecting the change in current I, electromagnetic wave detector 100 can detect the electromagnetic wave having the detection wavelength.

Here, the electromagnetic wave detector of the first embodiment is not limited to the configuration for detecting the change in current in two-dimensional material layer 1 as described above, and for example, a constant current may be caused to flow between first electrode portion 5 and second electrode portion 6, and the change in voltage V between first electrode portion 5 and second electrode portion 6 (that is, the change in the voltage value in two-dimensional material layer 1) may be detected.

The electromagnetic wave may be detected using two or more of the same electromagnetic wave detectors. For example, two or more of the same electromagnetic wave detectors are prepared. One electromagnetic wave detector is disposed in a shielded space that is not irradiated with the electromagnetic wave. Another electromagnetic wave detector is disposed in a space irradiated with the electromagnetic wave to be measured. Then, a difference between current I or voltage V of another electromagnetic wave detector irradiated with the electromagnetic wave and current I or voltage V of the electromagnetic wave detector disposed in the shielded space is detected. In this manner, the electromagnetic wave may be detected.

Advantageous Effect

Electromagnetic wave detector 100 of the first embodiment includes the plurality of photoelectric conversion elements PCE and plasmon filter 3. The plurality of through-holes 30 are periodically formed in plasmon filter 3. Each photoelectric conversion element PCE mainly includes semiconductor layer 2, insulating layer 4, two-dimensional material layer 1, first electrode portion 5, and second electrode portion 6. Semiconductor layer 2 has region 20 overlapping with one through-hole 30 in planar view. Insulating layer 4 is formed so as to cover a part of region 20. Two-dimensional material layer 1 is disposed on the other part of region 20 and insulating layer 4, and electrically connected to the other part of region 20. First electrode portion 5 is electrically connected to two-dimensional material layer 1. Second electrode portion 6 is electrically connected to semiconductor layer 2.

In electromagnetic wave detector 100, only the electromagnetic wave transmitted through plasmon filter 3 is incident on semiconductor layers 2 of the plurality of photoelectric conversion elements PCE. As described above, plasmon filter 3 transmits only the electromagnetic wave having a specific wavelength, and further has an effect of improving the quantum efficiency of semiconductor layer 2 at the specific wavelength. Therefore, electromagnetic wave detector 100 can selectively detect only the electromagnetic wave in a specific wavelength band with high accuracy as compared with the detector described in PTL 1.

Furthermore, in electromagnetic wave detector 100, the photoelectric conversion element PCE includes two-dimensional material layer 1 disposed on another part of region 20 overlapping with the plurality of through-holes of plasmon filter 3 and insulating layer 4 and electrically connected to the other part of region 20. Therefore, as described above, in electromagnetic wave detector 100, the photocurrent is amplified by the optical gate effect. The optical gate effect does not directly enhance the quantum efficiency of the photoelectric conversion material but increases the current change due to the incidence of the electromagnetic wave, so that the quantum efficiency equivalently calculated from the differential current due to the incidence of the electromagnetic wave can exceed 100%.

Therefore, the change amount of current I when the electromagnetic wave is incident on electromagnetic wave detector 100 is larger than the change amount of the current when the electromagnetic wave is incident on the detector described in PTL 1 in which the optical gate effect is not exhibited. Therefore, electromagnetic wave detector 100 has higher sensitivity than the detector described in PTL 1.

For example, when two-dimensional material layer 1 is single layer graphene, the thickness of two-dimensional material layer 1 is as thin as one atomic layer. In addition, carrier mobility in the single-layer graphene is larger than that of a conventional semiconductor material. In particular, in two-dimensional material layer 1, the large current change is generated with respect to the slight potential change as compared with the conventional semiconductor material. For example, the electric potential applied to two-dimensional material layer 1 changes as an electric field of semiconductor layer 2 changes, but the current change amount caused by this potential change is larger than the current change amount in a normal semiconductor. Specifically, when calculated from the electron mobility, the thickness, and the like in two-dimensional material layer 1, the current change amount in two-dimensional material layer 1 is about several hundred times to several thousand times the current change amount in the normal semiconductor. Such electromagnetic wave detector 100 has higher sensitivity than the electromagnetic wave detector that detects only the photocarriers generated in semiconductor layer 2.

In the electromagnetic wave detector 100, two-dimensional material layer 1 is electrically connected to the other part of semiconductor layer 2 at the opening, and specifically, forms the Schottky junction with semiconductor layer 2. Because two-dimensional material layer 1 and semiconductor layer 2 are joined to form the Schottky junction, the current foes not flow when the reverse bias is applied, and electromagnetic wave detector 100 can perform an OFF operation.

In electromagnetic wave detector 100, one end in the longitudinal direction of two-dimensional material layer 1 is disposed in region 20 of semiconductor layer 2. Therefore, the contact state between two-dimensional material layer 1 and semiconductor layer 2 becomes relatively good, and the movement of the photocarriers generated by the electromagnetic wave irradiation is hardly hindered at the contact interface between two-dimensional material layer 1 and semiconductor layer 2. As a result, the performance of electromagnetic wave detector 100 is improved. When the optical gating effect is dominant as an effect of amplifying the photocurrent amount, the sensitivity of electromagnetic wave detector 100 does not greatly depend on the contact area between two-dimensional material layer 1 and semiconductor layer 2. Therefore, when the optical gate effect is used, the area of the pixel can be reduced, and the pixel can be downsized. On the other hand, in a general quantum infrared sensor, when the area of the pixel is reduced, the sensitivity inevitably decreases. Therefore, it is also difficult to reduce a dark current.

Second Embodiment

Figure 4:
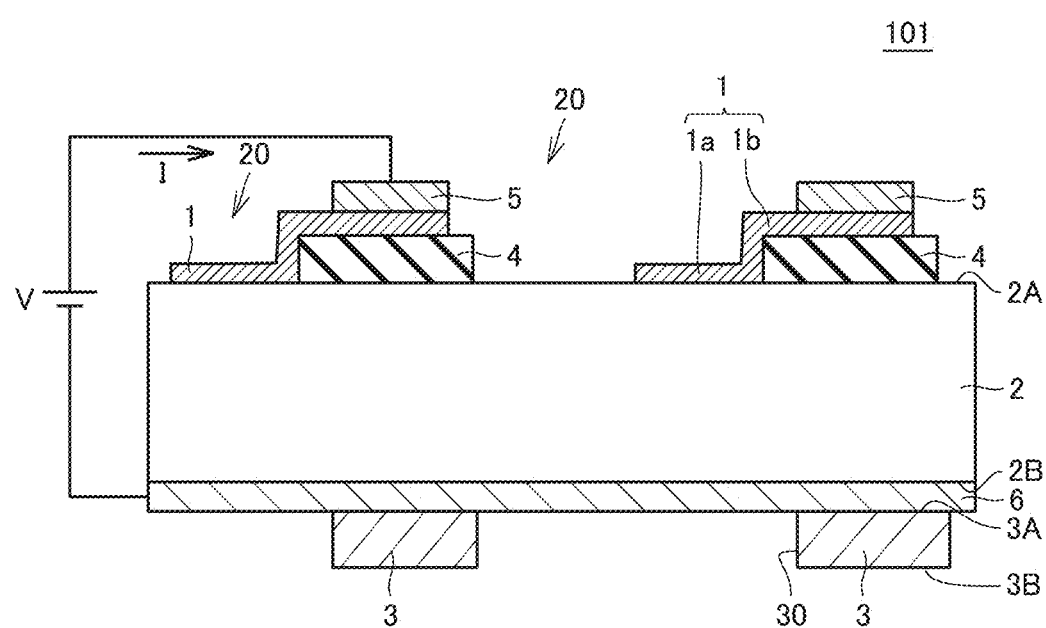
FIG. 4 is a sectional view illustrating an electromagnetic wave detector according to a second embodiment.

As illustrated in FIG. 4, an electromagnetic wave detector 101 according to a second embodiment has a configuration basically similar to that of electromagnetic wave detector 100 of the first embodiment, and can obtain a similar effect, but is different from electromagnetic wave detector 100 in that plasmon filter 3 is disposed on the opposite side of semiconductor layer 2 from insulating layer 4, two-dimensional material layer 1, and first electrode portion 5.

As illustrated in FIG. 4, insulating layer 4, two-dimensional material layer 1, and first electrode portion 5 are disposed on first surface 2A of semiconductor layer 2. Plasmon filter 3 and second electrode portion 6 are disposed on second surface 2B of semiconductor layer 2. Plasmon filter 3 is disposed on second electrode portion 6. Plasmon filter 3 is disposed on the side opposite to semiconductor layer 2 with respect to second electrode portion 6. The material constituting second electrode portion 6 is a conductive material that transmits the electromagnetic wave having the detection wavelength.

First surface 2A in a region other than the plurality of regions 20 is in contact with insulating layer 4. First surface 2A of each region 20 has a first contact region in contact with a first portion of later-described two-dimensional material layer 1, a second contact region in contact with a part of insulating layer 4, and a region exposed from two-dimensional material layer 1 and insulating layer 4 in planar view. The entire surface of second surface 2B is in contact with second electrode portion 6. Third surface 3A of plasmon filter 3 is in contact with second electrode portion 6.

Insulating layer 4 is disposed on first surface 2A of semiconductor layer 2 with no other member interposed therebetween. A part of insulating layer 4 disposed on a region other than the plurality of regions 20 is in contact with first surface 2A of semiconductor layer 2. Insulating layer 4 does not include a part disposed on plasmon filter 3 and is not formed stepwise. Two-dimensional material layer 1 is disposed on the second contact region of region 20 and insulating layer 4. A part of two-dimensional material layer 1 disposed on the region other than the plurality of regions 20 is disposed on insulating layer 4 in contact with first surface 2A of semiconductor layer 2. Two-dimensional material layer 1 includes first part 1a disposed on the first contact region and second part 1b disposed on insulating layer 4, and is formed stepwise but does not include the third part disposed on plasmon filter 3. The number of steps of two-dimensional material layer 1 is one. First electrode portion 5 is electrically connected to second part 1b of two-dimensional material layer 1.

The method for manufacturing electromagnetic wave detector 101 basically has the same configuration as the method for manufacturing electromagnetic wave detector 10, but is different from the method for manufacturing electromagnetic wave detector 100 in that the process of forming plasmon filter 3 is performed after the process of forming second electrode portion 6 and before the process of removing the protective film that has protected first surface 2A.

The number of steps of two-dimensional material layer 1 is smaller in electromagnetic wave detector 101 than in electromagnetic wave detector 100, so that a manufacturing yield and detection performance can be improved. For example, when the material constituting semiconductor layer 2 contains Si, insulating layer 4 can be constituted by a thermal oxide film of Si. In such electromagnetic wave detector 101, because the thermal oxide film has less surface irregularities and less residual charges than electromagnetic wave detector 100 including insulating layer 4 formed by the CVD method or the like, the mobility of two-dimensional material layer 1 is not hindered, so that the mobility is improved and the performance of electromagnetic wave detector 101 is improved.

<Modification>

Figure 5:
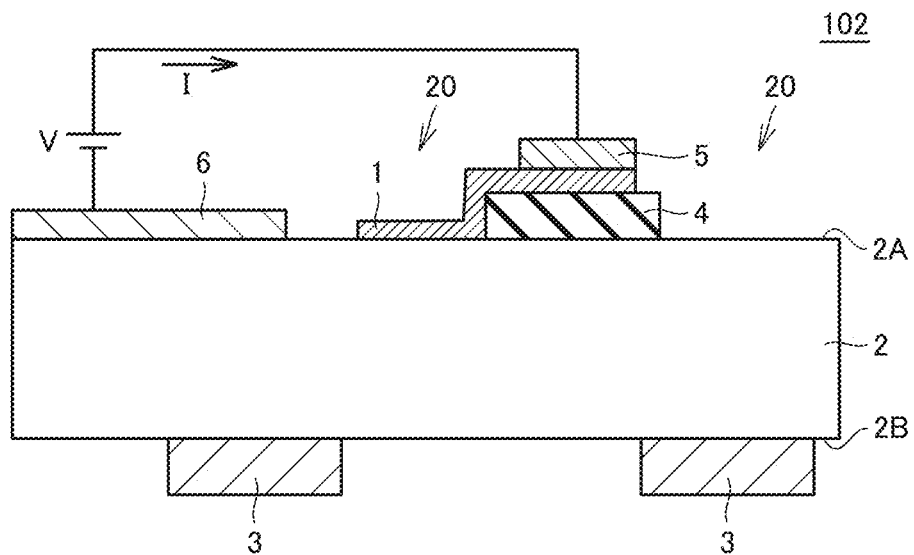
FIG. 5 is a sectional view illustrating a modification of the electromagnetic wave detector of the second embodiment.

As illustrated in FIG. 5, in electromagnetic wave detector 102 that is a modification of electromagnetic wave detector 101, second electrode portion 6 is disposed on first surface 2A of semiconductor layer 2 similarly to insulating layer 4, two-dimensional material layer 1, and first electrode portion 5. Plasmon filter 3 is disposed on the opposite side of semiconductor layer 2 from insulating layer 4, two-dimensional material layer 1, first electrode portion 5, and second electrode portion 6. Second electrode portion 6 is in contact with first surface 2A of semiconductor layer 2. For example, second electrode portion 6 is in contact with each of first surfaces 2A of other regions other than the plurality of regions 20 and some regions 20 among the plurality of regions 20.

Electromagnetic wave detector 102 has a configuration basically similar to that of electromagnetic wave detector 101, so that the same effect as that of electromagnetic wave detector 101 can be obtained.

Third Embodiment

Figure 6:
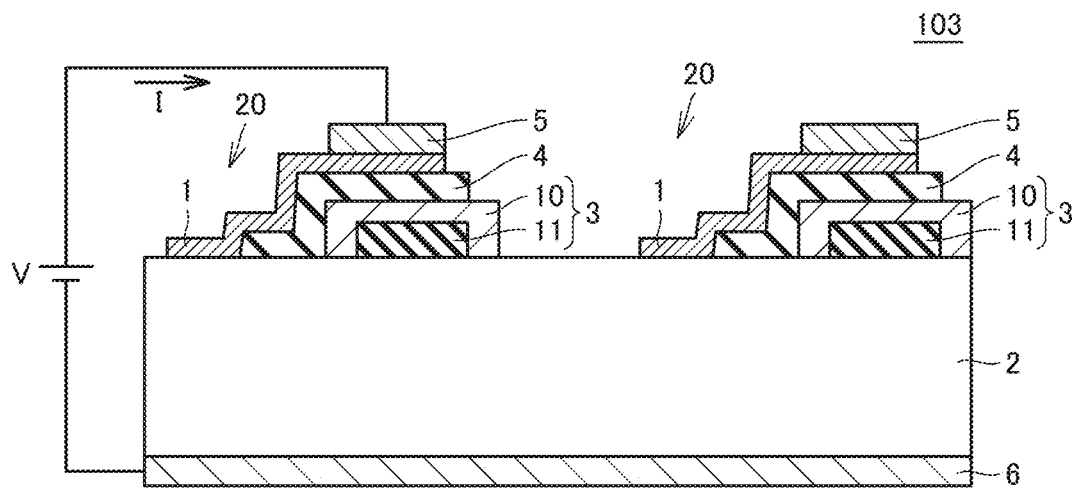
FIG. 6 is a sectional view illustrating an electromagnetic wave detector according to a third embodiment.

As illustrated in FIG. 6, an electromagnetic wave detector 103 according to a third embodiment has a configuration basically similar to that of electromagnetic wave detector 100 of the first embodiment, and can obtain a similar effect, but is different from electromagnetic wave detector 100 in that a material constituting a part of the surface of plasmon filter 3 includes the above-described plasmon resonance material. In other words, electromagnetic wave detector 103 is different from electromagnetic wave detector 100 in that plasmon filter 3 includes first member 10 made of the plasmon resonance material and second member 11 not made of the plasmon resonance material.

For example, second member 11 is configured as a core material. Second member 11 has the surface in contact with first surface 2A of semiconductor layer 2 and other surfaces. First member 10 is configured as a packaging material covering the entire other surface of second member 11.

For example, the material constituting second member 11 includes a dielectric material. For example, the material constituting second member 11 includes at least one of silicon oxide and silicon nitride.

The method for manufacturing electromagnetic wave detector 103 basically has the same configuration as the method for manufacturing electromagnetic wave detector 100, but is different from the method for manufacturing electromagnetic wave detector 100 in that second member 11 is first formed and processed and then first member 10 is formed in the process of forming plasmon filter 3.

In this case, the process of forming plasmon filter 3 can be performed only by the process of forming second member 11, the process of processing second member 11, and the process of forming first member 10. In other words, the process of processing the plasmon resonance material may not be required in the process of forming plasmon filter 3. In general, processing of the dielectric material is easier than processing of the plasmonic resonance material. In addition, in general, the cost of the dielectric material is lower than the cost of Au, Ag. or the like.

For this reason, the manufacturing cost of electromagnetic wave detector 103 is lower than the manufacturing cost of electromagnetic wave detector 100.

Electromagnetic wave detector 103 may have the same configuration as electromagnetic wave detector 101 or electromagnetic wave detector 102 except that second member 11 not made of the plasmon resonance material is included.

Fourth Embodiment

Figure 7:
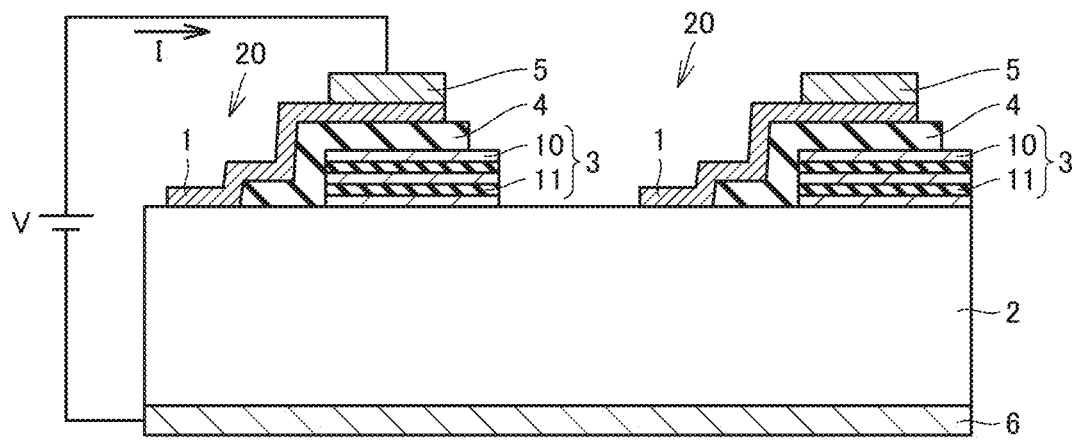
FIG. 7 is a sectional view illustrating an electromagnetic wave detector according to a fourth embodiment.

As illustrated in FIG. 7, an electromagnetic wave detector 104 according to a fourth embodiment is different from electromagnetic wave detector 103 of the third embodiment in that plasmon filter 3 includes first member 10 made of the plasmon resonance material and second member 11 not made of the plasmon resonance material similarly to electromagnetic wave detector 100 of the third embodiment.

Electromagnetic wave detector 104 has a configuration basically similar to that of electromagnetic wave detector 103, and can obtain a similar effect, but is different from electromagnetic wave detector 103 in that first member 10 and second member 11 are laminated along hole axis directions of the plurality of through-holes 30.

Plasmon filter 3 is configured as a multilayer body of at least two first members 10 and at least one second member 11. For example, plasmon filter 3 includes at least three first members 10 and at least two second members 11.

The material constituting first member 10 is the plasmon resonance material. The material constituting second member 11 is the dielectric material. For example, the material constituting second member 11 includes at least one of silicon oxide and silicon nitride.

First member 10 and second member 11 constitute a capacitance. Plasmon filter 3 may act similarly to a split-ring resonator or hyperbolic metamaterial at the detection wavelength, so that a refractive index becomes a negative value or zero at the detection wavelength, resulting in a condensing effect or a lens effect. As a result, the opening area of each through-hole 30 in electromagnetic wave detector 104 can be made smaller than the opening area of each through-hole 30 in electromagnetic wave detector 100. That is, a pixel of electromagnetic wave detector 104 can be made smaller than a pixel of electromagnetic wave detector 100. Thus, comparing electromagnetic wave detector 104 and electromagnetic wave detector 100 having the same outer dimensions, electromagnetic wave detector 104 can have many pixels and high resolution as compared with electromagnetic wave detector 100.

Electromagnetic wave detector 104 may have the same configuration as electromagnetic wave detector 101 or electromagnetic wave detector 102 except that first member 10 made of the plasmon resonance material and second member 11 not made of the plasmon resonance material are included.

Fifth Embodiment

Figure 8:
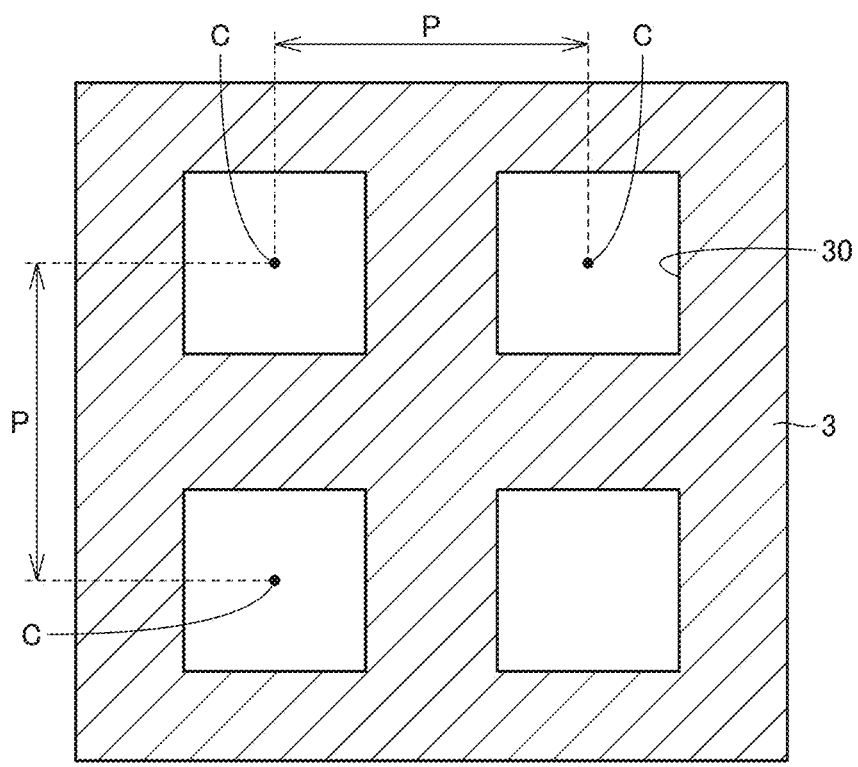
FIG. 8 is a plan view illustrating a plasmon filter of an electromagnetic wave detector according to a fifth embodiment.

An electromagnetic wave detector according to a fifth embodiment has a configuration basically similar to that of electromagnetic wave detector 100 of the first embodiment, and can obtain a similar effect, but is different from electromagnetic wave detector 100 in that it is specified that a period P of the plurality of through-holes 30 of plasmon filter 3 in FIG. 8 is equal to the detection wavelength.

In the fifth embodiment, period P is a main parameter determining the wavelength band selected by plasmon filter 3. When the detection wavelength is within an infrared wavelength band, the opening width and the depth (the thickness of plasmon filter 3) of each of the plurality of through-holes 30 of plasmon filter 3 are about ¼ of the detection wavelength.

In period P of the plurality of through-holes 30, manufacturing variation is less likely to be generated as compared with the opening width and depth of each of the plurality of through-holes 30. For this reason, in the electromagnetic wave detector of the fifth embodiment, as compared with electromagnetic wave detector 100, even when variations are generated in the opening width and the depth of each of the plurality of through-holes 30 of plasmon filter 3, the selection performance of the detection wavelength is less likely to be affected by the variations.

As described above, the planar shape of each of the plurality of through-holes 30 may be any shape. As illustrated in FIG. 8, for example, each planar shape of the plurality of through-holes 30 may be a square shape.

The electromagnetic wave detector of the fifth embodiment may have the same configuration as any of electromagnetic wave detector 101 to electromagnetic wave detector 104 of the second to fourth embodiments except that it is specified that period P of the plurality of through-holes 30 of plasmon filter 3 is equal to the detection wavelength.

Sixth Embodiment

An electromagnetic wave detector according to a sixth embodiment has a configuration basically similar to that of electromagnetic wave detector 100 of the first embodiment, and can obtain a similar effect. However, as illustrated in FIGS. 9 and 10, electromagnetic wave detector of the sixth embodiment is different from electromagnetic wave detector 100 in that it is specified that each planar shape of the plurality of through-holes 30 has the longitudinal direction and a lateral direction.

Figure 9:
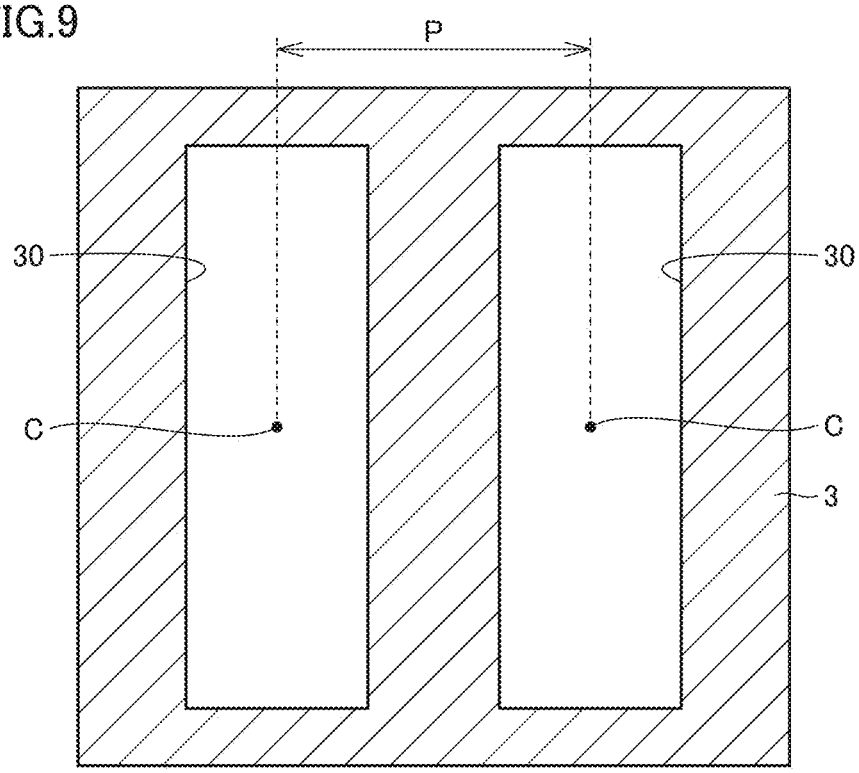
FIG. 9 is a plan view illustrating a plasmon filter of an electromagnetic wave detector according to a sixth embodiment.
Figure 10:
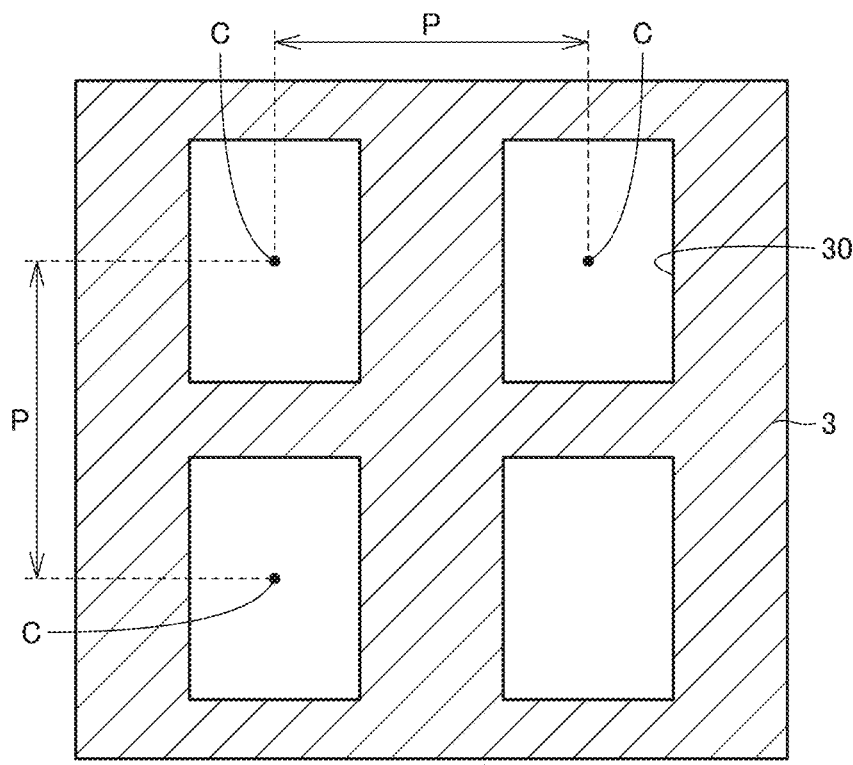
FIG. 10 is a plan view illustrating still another modification of the plasmon filter of the electromagnetic wave detector the sixth embodiment.

In plasmon filter 3 of FIGS. 9 and 10, the planar shape of each through-hole 30 has symmetry with respect to only one virtual straight line along third surface 3A. In other words, the planar shape of each through-hole 30 has the longitudinal direction and the lateral direction. For example, the longitudinal directions of through-holes 30 are parallel to each other. For example, the lateral directions of through-holes 30 are parallel to each other.

In plasmon filter 3, the surface plasmon resonance is generated only when the electromagnetic wave having the detection wavelength and having the electric field orthogonal to the longitudinal direction in the planar shape of each through-hole 30 is irradiated. That is, plasmon filter 3 in FIGS. 9 and 10 has polarization selectivity. Therefore, the electromagnetic wave detector including plasmon filter 3 can detect only specific polarized light among the electromagnetic waves having the detection wavelength. The electromagnetic wave detector capable of detecting such polarized light can perform discrimination between an artificial object and a natural object, for example, discrimination of oil floating on the sea surface, discrimination of a vehicle in a desert, or discrimination of a human body and a road in summer. In addition, the electromagnetic wave detector capable of detecting such polarized light can also be used for determining a polarization characteristic of a molecule.

As illustrated in FIG. 10, for example, period P in the longitudinal direction of each through-hole 30 may be equal to period P in the lateral direction of each through-hole 30. Furthermore, for example, period P in the longitudinal direction of each through-hole 30 may be different from period P in the lateral direction of each through-hole 30. In addition, the arrangement of the plurality of through-holes 30 may be asymmetric in the lateral direction of each through-hole 30.

Electromagnetic wave detector of the sixth embodiment may have the same configuration as any of electromagnetic wave detector 101 to electromagnetic wave detector 104 of the second to fifth embodiments except that it is specified that each planar shape of the plurality of through-holes 30 has the longitudinal direction and the lateral direction.

Seventh Embodiment

Figure 11:
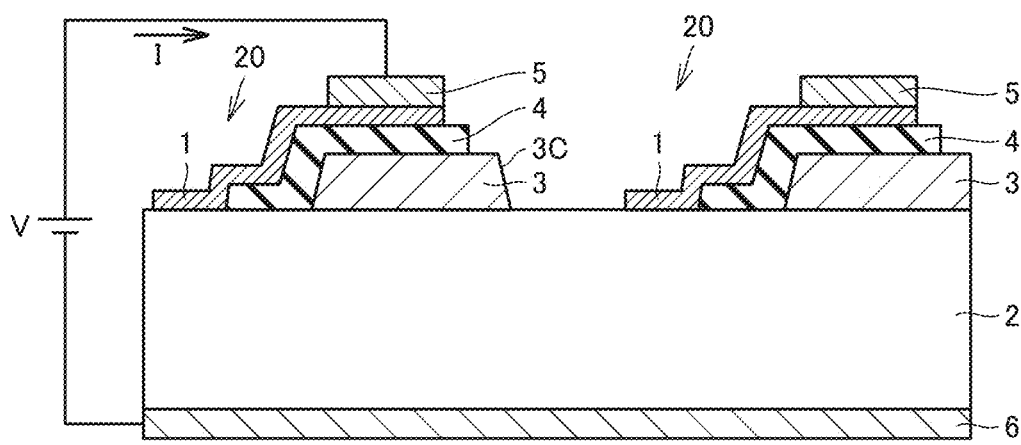
FIG. 11 is a sectional view illustrating an electromagnetic wave detector according to a seventh embodiment.

As illustrated in FIG. 11, an electromagnetic wave detector 105 of the seventh embodiment has a configuration basically similar to that of electromagnetic wave detector 100 of the first embodiment, and can obtain a similar effect, but is different from electromagnetic wave detector 100 in that each inner peripheral surfaces 3C of the plurality of through-holes 30 is inclined with respect to each hole axes of each through-holes 30.

As illustrated in FIG. 11, for example, the sectional shape of plasmon filter 3 is what is called a forward tapered shape. Each inner peripheral surface 3C of the plurality of through-holes 30 forms an acute angle with respect to third surface 3A and an obtuse angle with respect to fourth surface 3B. The wavelength band, a half-value width, and a quality factor of the resonance wavelength are controlled according to the angle (hereinafter, the inclination angle) formed by inner peripheral surface 3C with respect to third surface 3A.

Basically, as the inclination angle is smaller, the wavelength band of the electromagnetic wave transmitted by plasmon filter 3 becomes narrower. As a result, electromagnetic wave detector 105 in FIG. 11 has higher wavelength selectivity (monochromaticity) of the electromagnetic wave than electromagnetic wave detector 100 in FIG. 1, and can detect the electromagnetic wave having the detection wavelength with higher accuracy.

Furthermore, for example, the sectional shape of plasmon filter 3 may be what is called a reverse tapered shape. Each inner peripheral surface 3C of the plurality of through-holes 30 may form the obtuse angle with respect to third surface 3A and the acute angle with respect to fourth surface 3B. Basically, as the inclination angle is larger, the wavelength band of the electromagnetic wave transmitted by plasmon filter 3 is wider.

A contribution degree of the inclination angle to the wavelength band varies depending on whether the periodicity of the plurality of through-holes 30 is one-dimensional or two-dimensional, the planar shape of each of the plurality of through-holes 30, and the like.

Electromagnetic wave detector of the seventh embodiment may have the same configuration as any of electromagnetic wave detector 101 to electromagnetic wave detector 104 of the second to sixth embodiments except that it is specified that each planar shape of the plurality of through-holes 30 has the longitudinal direction and the lateral direction.

Eighth Embodiment

Figure 12:
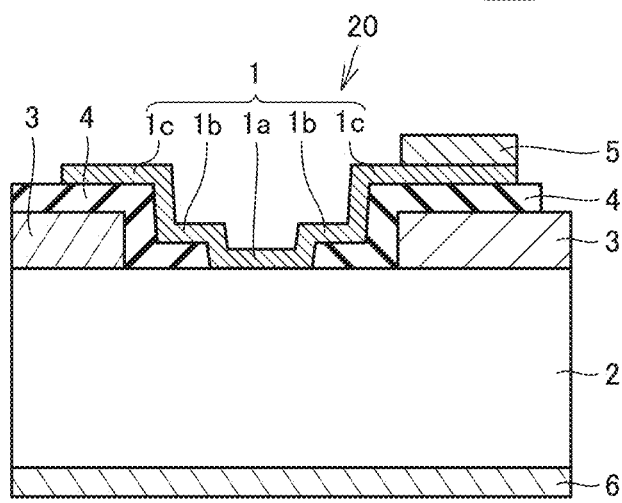
FIG. 12 is a sectional view illustrating an electromagnetic wave detector according to an eighth embodiment.
Figure 13:
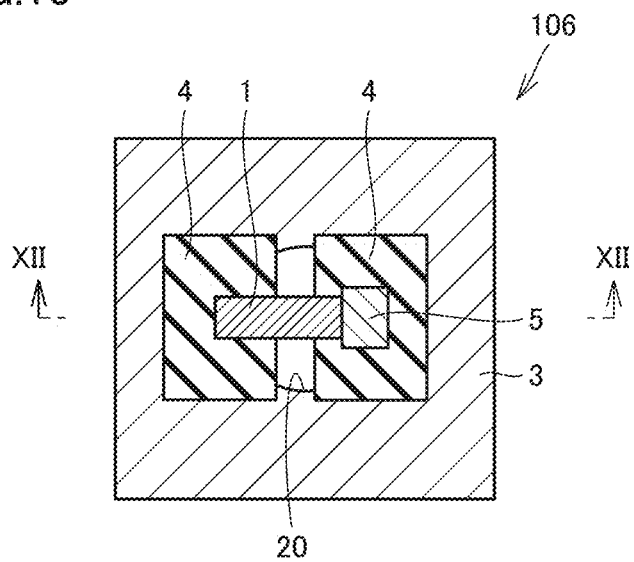
FIG. 13 is a plan view illustrating the electromagnetic wave detector in FIG. 12.

As illustrated in FIGS. 12 and 13, an electromagnetic wave detector 106 according to an eighth embodiment has a configuration basically similar to that of electromagnetic wave detector 100 of the first embodiment, and exhibits the same effect, but is different from electromagnetic wave detector 100 in that the end in the longitudinal direction of two-dimensional material layer 1 is disposed on insulating layer 4.

For example, the longitudinal end of two-dimensional material layer 1 is disposed on insulating layer 4 disposed on plasmon filter 3. In this case, two-dimensional material layer 1 has first part 1a, and at least two second parts 1b and third parts 1c disposed so as to sandwich first part Ia. For example, the longitudinal end of two-dimensional material layer 1 may be disposed on insulating layer 4 disposed on region 20. In this case, two-dimensional material layer 1 has first part 1a, third part 1c, and at least two second parts 1b disposed so as to sandwich first part Ia.

Electromagnetic wave detector of the eighth embodiment may have the same configuration as any of electromagnetic wave detector 101 to electromagnetic wave detector 105 of the second to seventh embodiments except that the longitudinal end of two-dimensional material layer 1 is disposed on insulating layer 4.

Ninth Embodiment

Figure 14:
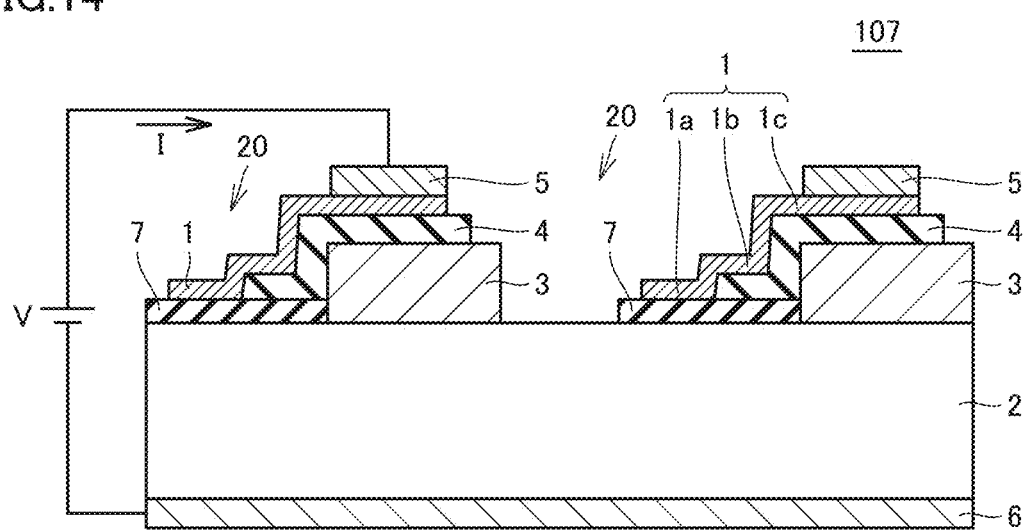
FIG. 14 is a sectional view illustrating an electromagnetic wave detector according to a ninth embodiment.

As illustrated in FIG. 14, an electromagnetic wave detector 107 according to a ninth embodiment has a configuration basically similar to that of electromagnetic wave detector 100 of the first embodiment, and exhibits an equivalent effect, but is different from electromagnetic wave detector 100 in that a buffer layer 7 is disposed between two-dimensional material layer 1 and semiconductor layer 2 inside through-hole 30.

Buffer layer 7 electrically connects first part 1a of two-dimensional material layer 1 and region 20 of semiconductor layer 2. Specifically, buffer layer 7 is provided such that first part 1a of two-dimensional material layer 1 and the first contact region of semiconductor layer 2 are electrically connected by the tunnel current. The material constituting buffer layer 7 may be any material having electrical insulation properties, and for example, includes at least one selected from the group consisting of $SiO_2$, $Si_3N_4$, $HfO_2$, $Al_2O_3$, and BN.

Buffer layer 7 may be disposed on at least the first contact region of region 20, but for example, is disposed on the first contact region and the second contact region. For example, buffer layer 7 is provided so as to expose a part of region 20.

The thickness of buffer layer 7 is set such that, for example, when the electromagnetic wave having the detection wavelength is incident, the tunnel current can be generated between two-dimensional material layer 1 and semiconductor layer 2. For example, the thickness of buffer layer 7 is greater than or equal to 1 nm and less than or equal to 10 nm. The thickness of buffer layer 7 is determined according to the detection wavelength. A method for manufacturing buffer layer 7 may be any method, and for example, may be selected from an atomic layer deposition (ALD) method, a vacuum deposition method, and a sputtering method. Alternatively, buffer layer 7 may be formed by oxidizing or nitriding the surface of semiconductor layer 2. Alternatively, buffer layer 7 may be a natural oxide film formed on the surface of semiconductor layer 2.

In electromagnetic wave detector 107, by preventing the leakage current at a junction interface between semiconductor layer 2 and two-dimensional material layer 1 by buffer layer 7, the dark current can be reduced as compared with electromagnetic wave detector 100 not including buffer layer 7. In electromagnetic wave detector 107, by setting the film thickness of buffer layer 7 to such the thickness that the tunnel injection is generated from semiconductor layer 2 to two-dimensional material layer 1, the large photocurrent is injected into two-dimensional material layer 1, and the sensitivity is high.

The thickness of buffer layer 7 may be larger than the thickness capable of forming the tunnel current between two-dimensional material layer 1 and semiconductor layer 2 and smaller than the thickness of insulating layer 4. In this case, the photocarriers generated in semiconductor layer 2 are not injected into two-dimensional material layer 1, but only the optical gate effect is generated. When buffer layer 7 is thinner than insulating layer 4, a gradient of the carrier density is generated between two-dimensional material layer 1 in contact with insulating layer 4 and two-dimensional material layer 1 in contact with buffer layer 7. As a result, the mobility of two-dimensional material layer 1 is improved, so that the sensitivity is increased.

Electromagnetic wave detector 107 of the ninth embodiment may have the same configuration as any of electromagnetic wave detector 101 to electromagnetic wave detector 106 of the second to eighth embodiments except that buffer layer 7 is disposed between two-dimensional material layer 1 and semiconductor layer 2 in each through-hole 30.

Tenth Embodiment

Figure 15:
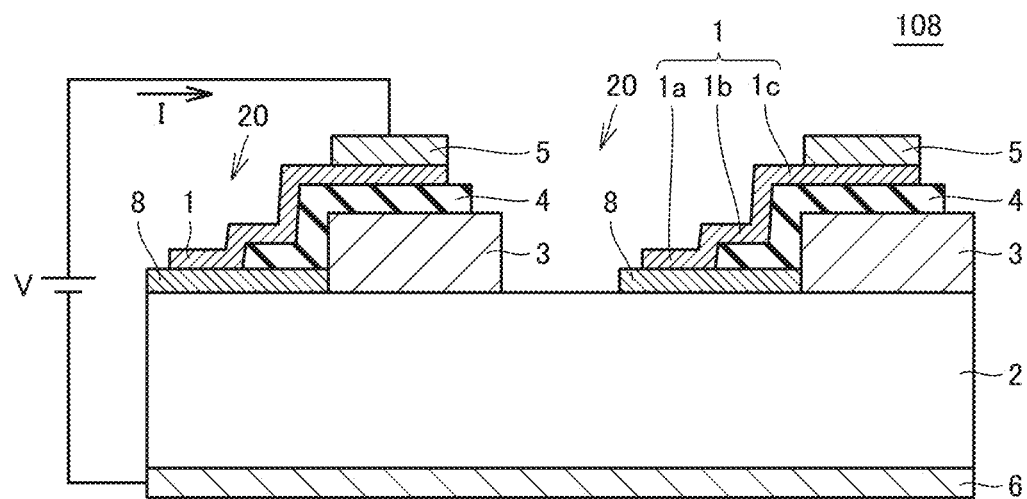
FIG. 15 is a sectional view illustrating an electromagnetic wave detector according to a tenth embodiment.

As illustrated in FIG. 15, an electromagnetic wave detector 108 according to a tenth embodiment has a configuration basically similar to that of electromagnetic wave detector 100 of the first embodiment, and exhibits an equivalent effect, but is different from electromagnetic wave detector 100 in that a connection conductor 8 is disposed between two-dimensional material layer 1 and semiconductor layer 2 in through-hole 30.

The connection conductor 8 electrically connects first part 1a of two-dimensional material layer 1 and region 20 of semiconductor layer 2. First part 1a of two-dimensional material layer 1 is electrically connected to the first contact region of semiconductor layer 2 with connection conductor 8 interposed therebetween.

Connection conductor 8 is desirably in ohmic contact with semiconductor layer 2. In addition, connection conductor 8 desirably exhibits high transmittance at the wavelength of the electromagnetic wave detected by the electromagnetic wave detector.

Connection conductor 8 may be disposed on at least the first contact region of region 20, but for example, is disposed on the first contact region and the second contact region. For example, connection conductor 8 is provided so as to expose a part of region 20.

In electromagnetic wave detector 108, by providing connection conductor 8 between two-dimensional material layer 1 and semiconductor layer 2, as compared with electromagnetic wave detector 100, the contact resistance between two-dimensional material layer 1 and semiconductor layer 2 can be reduced, and attenuation of photocurrent that becomes a problem when the junction between two-dimensional material layer 1 and semiconductor layer 2 is a Schottky junction can be prevented.

In electromagnetic wave detector 108, the thickness of connection conductor 8 and the thickness of insulating layer 4 are preferably substantially the same, namely, the position of the upper surface of connection conductor 8 is preferably substantially the same as the position of the upper surface of insulating layer 4. In this case, two-dimensional material layer 1 is horizontally formed without being bent, so that the carrier mobility in two-dimensional material layer 1 is improved. The optical gate effect is proportional to the mobility, so that the sensitivity of the electromagnetic wave detector is improved.

Electromagnetic wave detector 108 of the tenth embodiment may have the same configuration as any of electromagnetic wave detector 101 to electromagnetic wave detector 106 of the second to eighth embodiments except that connection conductor 8 is formed in each through-hole 30.

Eleventh Embodiment

Figure 16:
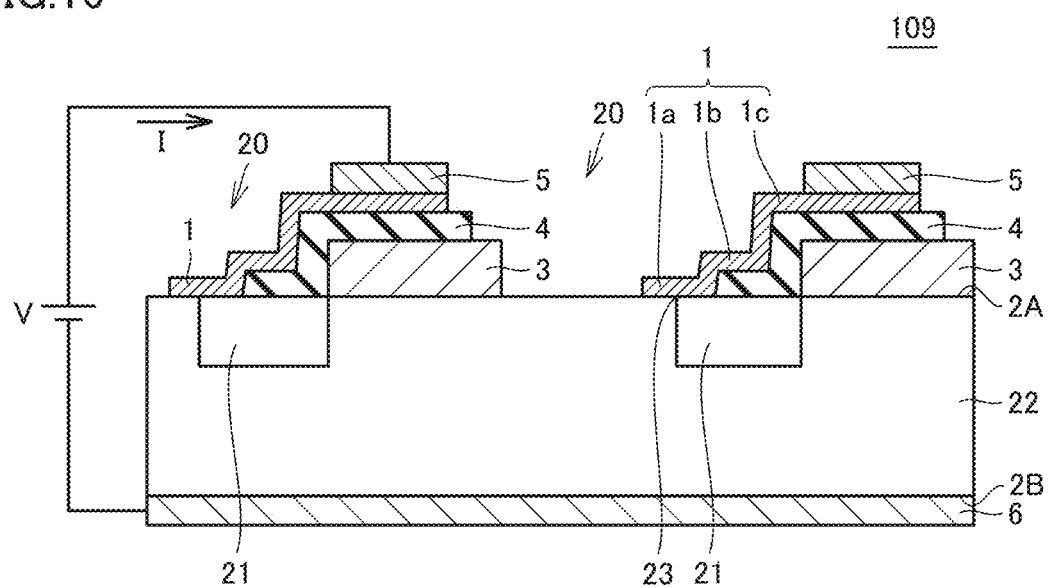
FIG. 16 is a sectional view illustrating an electromagnetic wave detector according to an eleventh embodiment.

As illustrated in FIG. 16, an electromagnetic wave detector 109 according to an eleventh embodiment has a configuration basically similar to that of electromagnetic wave detector 100 of the first embodiment, and exhibits a similar effect, but is different from electromagnetic wave detector 100 in that semiconductor layer 2 includes a first semiconductor part 21 having a first conductivity type and a second semiconductor part 22 that is bonded to first semiconductor part 21 and has a second conductivity type, and the junction interface between first semiconductor part 21 and second semiconductor part 22 is disposed in each region 20.

First semiconductor part 21 and second semiconductor part 22 are arranged side by side along first surface 2A. First semiconductor part 21 is doped with the carrier opposite to that of second semiconductor part 22. That is, first semiconductor part 21 and second semiconductor part 22 are pn-bonded. At least a part of each of first semiconductor part 21, second semiconductor part 22, and a pn junction interface 23 between first semiconductor part 21 and second semiconductor part 22 is disposed in region 20.

For example, the materials constituting first semiconductor part 21 and second semiconductor part 22 are the same semiconductor material.

As illustrated in FIG. 16, pn junction interface 23 between first semiconductor part 21 and second semiconductor part 22 is disposed so as to be in contact with first part 1a of two-dimensional material layer 1. Accordingly, the photocarriers generated at pn junction interface 23 between first semiconductor part 21 and second semiconductor part 22 when irradiated with electromagnetic waves can be easily taken out to two-dimensional material layer 1. Furthermore, the conductivity of two-dimensional material layer 1 on pn junction interface 23 changes under the influence of a local electric field change at the pn junction caused by photocarriers. As a result, the response speed of the electromagnetic wave detector is improved.

The materials constituting first semiconductor part 21 and second semiconductor part 22 may be different semiconductor materials. In this case, when electromagnetic wave detector 109 further includes plasmon filter 3 provided such that the plurality of resonance wavelengths exist, electromagnetic wave detector 109 can detect the plurality of electromagnetic waves in the narrow wavelength band.

Electromagnetic wave detector 109 of the eleventh embodiment may have the same configuration as any of electromagnetic wave detector 101 to electromagnetic wave detector 108 of the second to ninth embodiments except that connection conductor 8 is formed in each through-hole 30.

Twelfth Embodiment

Figure 17:
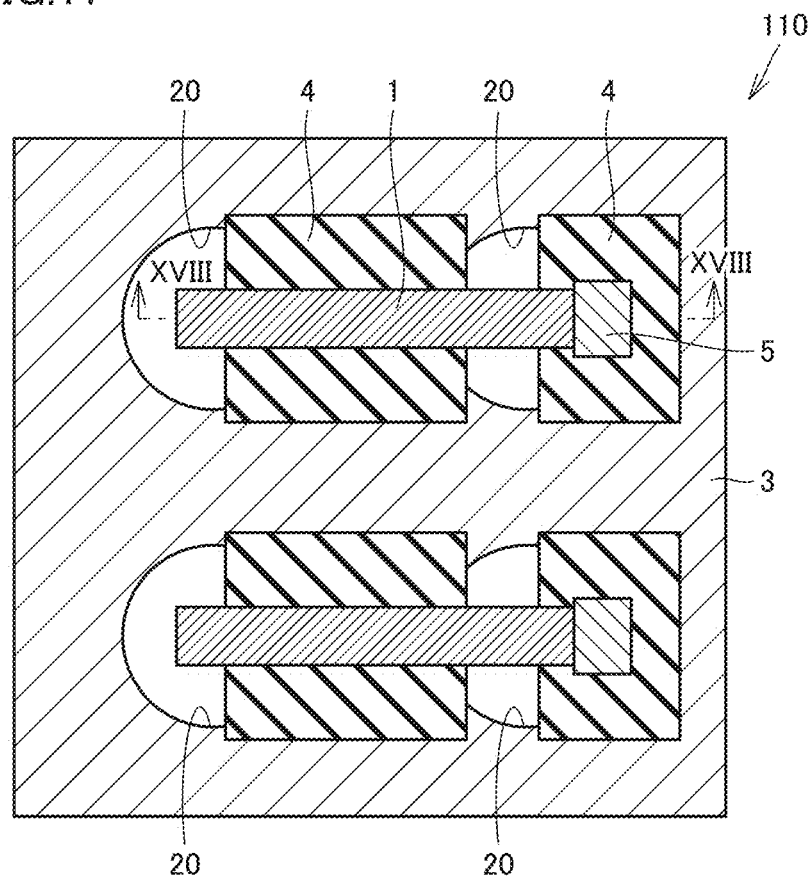
FIG. 17 is a plan view illustrating an electromagnetic wave detector according to a twelfth embodiment.
Figure 18:
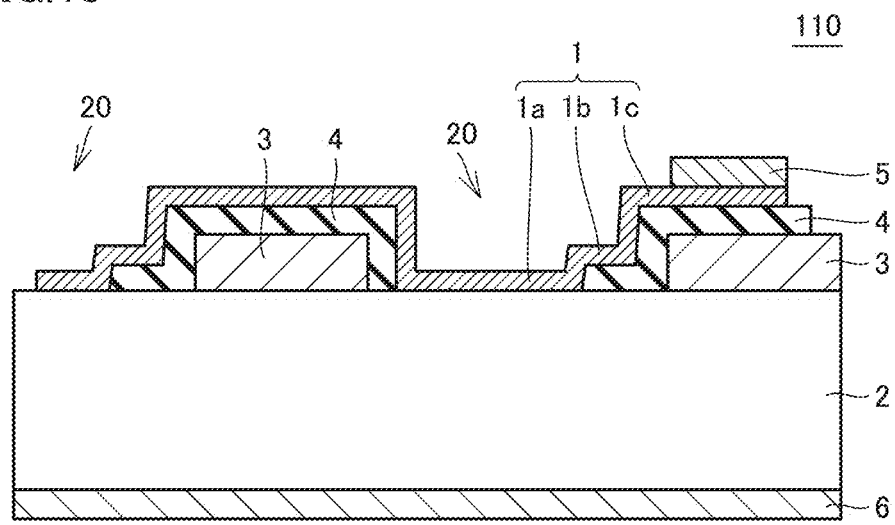
FIG. 18 is a sectional view taken along a line XVIII-XVIII in FIG. 17.

As illustrated in FIGS. 17 and 18, an electromagnetic wave detector 110 according to a twelfth embodiment has a configuration basically similar to that of electromagnetic wave detector 100 of the first embodiment, and exhibits an equivalent effect, but differs from electromagnetic wave detector 100 in that one two-dimensional material layer 1 is electrically connected to the first contact region of each of the plurality of regions 20. In FIG. 18, the electric wiring connected to first electrode portion 5 and second electrode portion 6 is omitted.

For example, one two-dimensional material layer 1 is electrically connected to each of two adjacent regions 20. One two-dimensional material layer 1 may be electrically connected to each of at least three adjacent regions 20.

Furthermore, in insulating layer 4 of FIG. 18, only a part located on one side with respect to through-hole 30 is provided in a stepwise manner, but both a part of insulating layer 4 located on one side with respect to through-hole 30 and a part located on the other side may be provided in a stepwise manner. From a different point of view, in two-dimensional material layer 1 of FIG. 18, the number of steps of the part located on one side with respect to through-hole 30 is larger than the number of steps of the part located on the other side, but the numbers of steps of the part located on one side and the part located on the other side with respect to through-hole 30 of two-dimensional material layer 1 may be equal to each other.

In electromagnetic wave detector 110, because the number of regions 20 to which one two-dimensional material layer 1 is electrically connected is larger than that in electromagnetic wave detector 100, the amount of photocarriers received by one two-dimensional material layer 1 from semiconductor layer 2 is larger. As a result, the sensitivity of electromagnetic wave detector 110 is higher than the sensitivity of electromagnetic wave detector 100.

Electromagnetic wave detector 110 of the twelfth embodiment may have the same configuration as any of electromagnetic wave detector 101 to electromagnetic wave detector 109 of the second to tenth embodiments except that one two-dimensional material layer 1 is electrically connected to the first contact region of each of the plurality of regions 20.

Thirteenth Embodiment

Figure 19:
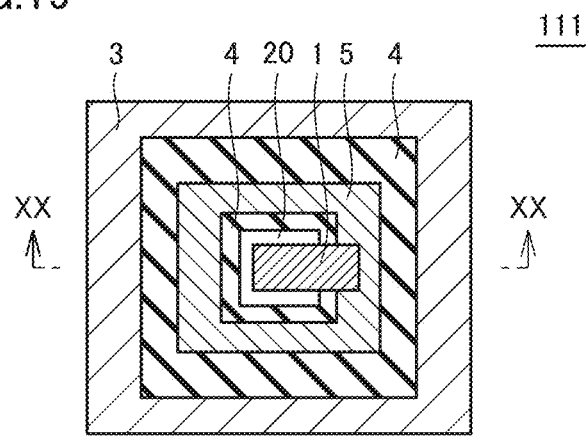
FIG. 19 is a plan view illustrating an electromagnetic wave detector according to a thirteenth embodiment.
Figure 20:
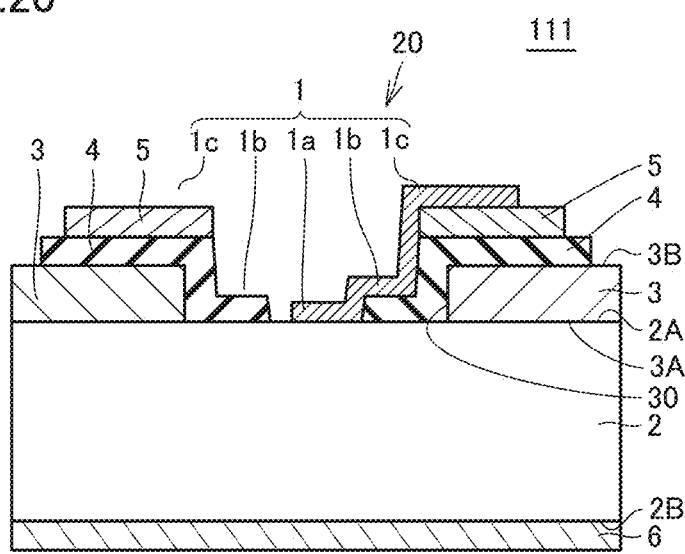
FIG. 20 is a sectional view taken along a line XX-XX in FIG. 19.

As shown in FIGS. 19 and 20, an electromagnetic wave detector 111 according to a thirteenth embodiment has a configuration basically similar to that of electromagnetic wave detector 100 of the first embodiment, and exhibits the same effect, but the configurations of first electrode portion 5 and insulating layer 4 are different from that of electromagnetic wave detector 100.

In electromagnetic wave detector 111, insulating layer 4 and first electrode portion 5 are formed in an annular shape, and the first part of two-dimensional material layer 1 is disposed inside insulating layer 4 and first electrode portion 5.

In electromagnetic wave detector 111, the photocurrent extracted from semiconductor layer 2 through two-dimensional material layer 1 increases as compared with electromagnetic wave detector 100, so that the detection sensitivity is high.

In FIGS. 19 and 20, third part 1e of two-dimensional material layer 1 is disposed on first electrode portion 5, but third part 1c of two-dimensional material layer 1 may be disposed below first electrode portion 5, <Modification>

Figure 21:
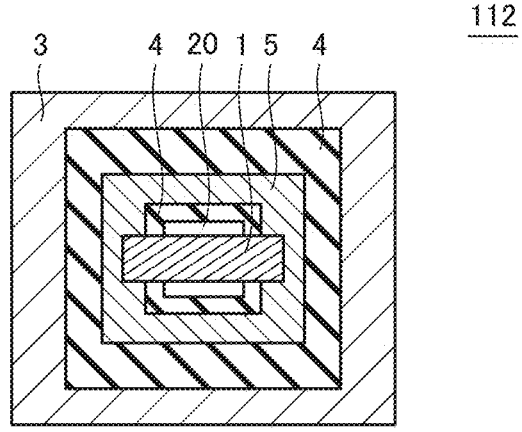
FIG. 21 is a schematic sectional view illustrating a modification of the electromagnetic wave detector of the thirteenth embodiment.

As illustrated in FIG. 21, in an electromagnetic wave detector 112 as a modification of electromagnetic wave detector 111, two-dimensional material layer 1 is electrically connected to a part of first electrode portion 5 located on one side with respect to through-hole 30 in first electrode portion 5, and is electrically connected to another part of first electrode portion 5 located on the other side with respect to through-hole 30.

Electromagnetic wave detector 112 has the configuration basically similar to that of electromagnetic wave detector 111, the same effect as that of electromagnetic wave detector 111 can be obtained.

In electromagnetic wave detector 111 and electromagnetic wave detector 112, the planar shape of first electrode portion 5 may be a C-shape. In other words, in planar view, the ends of first electrode portion 5 may be disposed at intervals in the circumferential direction of through-hole 30. In planar view, the ends of first electrode portion 5 may be spaced apart from each other in the radial direction of through-hole 30.

Electromagnetic wave detector 111, 112 of the thirteenth embodiment may have the same configuration as any of electromagnetic wave detector 101 to electromagnetic wave detector 110 of the second to twelfth embodiments except that insulating layer 4 and first electrode portion 5 are formed in an annular shape.

Fourteenth Embodiment

Figure 22:
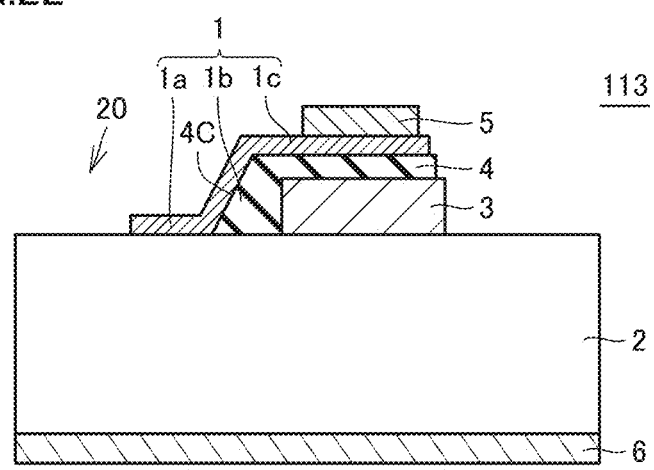
FIG. 22 is a sectional view illustrating an electromagnetic wave detector according to a fourteenth embodiment.

As illustrated in FIG. 22, an electromagnetic wave detector 113 according to a fourteenth embodiment has a configuration basically similar to that of electromagnetic wave detector 100 of the first embodiment, and can obtain a similar effect, but is different from electromagnetic wave detector 100 in that the thickness of insulating layer 4 changes from region 20 toward first electrode portion 5.

As illustrated in FIG. 22, the thickness of insulating layer 4 increases from region 20 toward first electrode portion 5. Insulating layer 4 has an inclined surface 4C inclined with respect to first surface 2A of semiconductor layer 2. An inclination angle formed by inclined surface 4C with respect to first surface 2A is an acute angle. At least a part of inclined surface 4C is disposed on region 20.

Two-dimensional material layer 1 extends on inclined surface 4C. Specifically, second part 1b of two-dimensional material layer 1 is disposed on inclined surface 4C.

Insulating layer 4 including inclined surface 4C can be formed by any method. For example, the insulating film is deposited while semiconductor layer 2 is inclined, so that insulating layer 4 including inclined surface 4C may be formed. Alternatively, insulating layer 4 previously formed on semiconductor layer 2 is dry etched while semiconductor layer 2 is inclined, so that insulating layer 4 including inclined surface 4C may be formed.

In electromagnetic wave detector 113, because the gradient is provided in the thickness of insulating layer 4, when semiconductor layer 2 is irradiated with the electromagnetic wave, a local change is generated in the degree of electric field change in two-dimensional material layer 1. That is, when semiconductor layer 2 is irradiated with the electromagnetic wave and the electric field change is applied to two-dimensional material layer 1, the degree of the electric field change locally changes according to the change in the thickness of insulating layer 4. Thus, the mobility of carriers in two-dimensional material layer 1 is improved, and the detection sensitivity of the electromagnetic wave detector is improved.

Electromagnetic wave detector 113 of the fourteenth embodiment may have the same configuration as any of electromagnetic wave detector 101 to electromagnetic wave detector 112 of the second to thirteenth embodiments except that the thickness of insulating layer 4 changes from region 20 toward first electrode portion 5.

Fifteenth Embodiment

Figure 23:
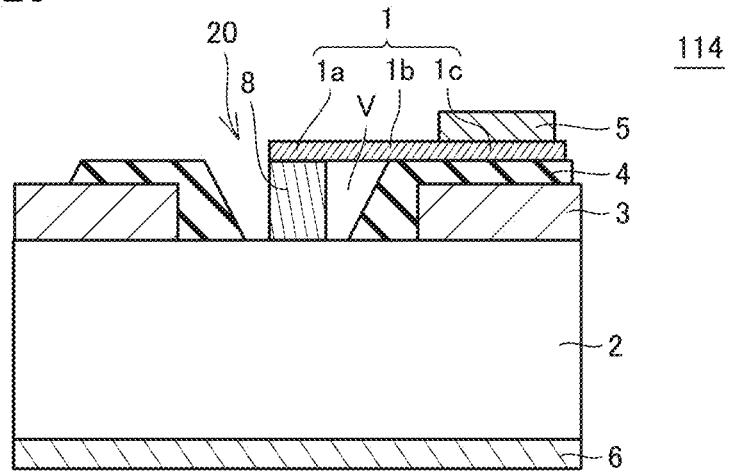
FIG. 23 is a sectional view illustrating an electromagnetic wave detector according to a fifteenth embodiment.

As illustrated in FIG. 23, an electromagnetic wave detector 114 according to a fifteenth embodiment has a configuration basically similar to that of electromagnetic wave detector 100 of the first embodiment, and can obtain a similar effect, but is different from electromagnetic wave detector 100 in that a gap V is formed between semiconductor layer 2 and two-dimensional material layer 1.

First part 1a of two-dimensional material layer 1 acting as a source region in the optical gate effect is electrically connected to the first contact region of semiconductor layer 2 with connection conductor 8 interposed therebetween. The thickness of connection conductor 8 is preferably equal to a sum of the thickness of plasmon filter 3 and the thickness of insulating layer 4. In this case, two-dimensional material layer 1 extends in a planar shape from connection conductor 8 onto insulating layer 4. The first contact region of semiconductor layer 2 is not in contact with two-dimensional material layer 1 but is in contact with connection conductor 8.

Second part 1b of two-dimensional material layer 1 that acts as the source region in the optical gate effect includes a part facing gap V and a part in contact with insulating layer 4. In this case, the photocarriers generated in semiconductor layer 2 during the incidence of the electromagnetic wave give the electric field effect to second part 1b of two-dimensional material layer 1 through part 4a of insulating layer 4 or gap V. That is, the optical gate effect is also generated in this configuration. Because two-dimensional material layer 1 and semiconductor layer 2 are not in direct contact with each other, the mobility of two-dimensional material layer 1 does not decrease. Therefore, the performance as the electromagnetic wave detector is also improved.

<Modification>

Figure 24:
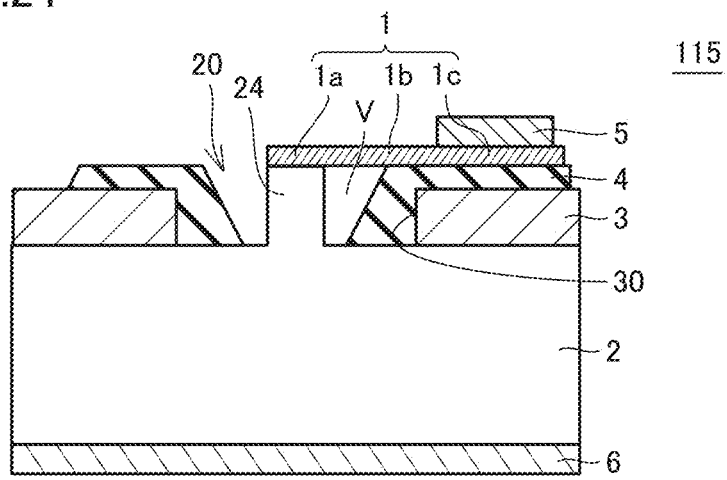
FIG. 24 is a sectional view illustrating a modification of the electromagnetic wave detector of the fifteenth embodiment.

As illustrated in FIG. 24, in an electromagnetic wave detector 115 as a modification of electromagnetic wave detector 114, semiconductor layer 2 includes a protrusion 24. Protrusion 24 is disposed inside through-hole 30 of plasmon filter 3, namely, on region 20. Two-dimensional material layer 1 is in contact with protrusion 24. Protrusion 24 includes the first contact region in contact with the first part of two-dimensional material layer 1 in semiconductor layer 2. The height of protrusion 24 is preferably equal to the sum of the thickness of plasmon filter 3 and the thickness of insulating layer 4 as illustrated in FIG. 24. In the process of preparing semiconductor layer 2 by the above-described manufacturing method, protrusion 24 can be formed by processing semiconductor layer 2 by photolithography, dry etching, or the like. Plasmon filter 3 can be formed on semiconductor layer 2 in which protrusion 24 is formed.

Also in this configuration, the optical gate effect is generated. Furthermore, because two-dimensional material layer 1 and insulating layer 4 are not in direct contact with each other in the part of gap V, the mobility of two-dimensional material layer 1 does not decrease. Therefore, the performance as the electromagnetic wave detector is also improved.

Electromagnetic wave detector 114, 115 of the fifteenth embodiment may have the same configuration as any of electromagnetic wave detector 101 to electromagnetic wave detector 113 of the second to fourteenth embodiments except that gap V is formed between semiconductor layer 2 and two-dimensional material layer 1.

Sixteenth Embodiment

Figure 25:
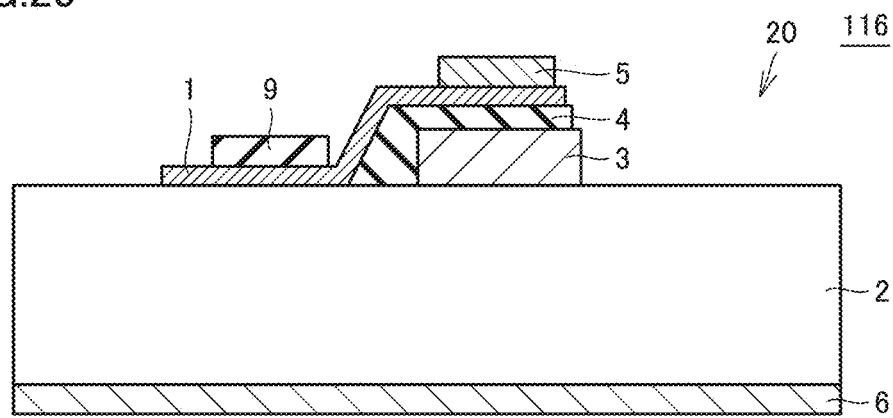
FIG. 25 is a schematic sectional view illustrating an electromagnetic wave detector according to a sixteenth embodiment.

As illustrated in FIG. 25, an electromagnetic wave detector 116 according to a sixteenth embodiment has a configuration basically similar to that of electromagnetic wave detector 100 of the first embodiment, and can obtain a similar effect, but differs from electromagnetic wave detector 100 in further including at least one contact layer 9 in contact with two-dimensional material layer 1.

For example, contact layer 9 is disposed on two-dimensional material layer 1. Contact layer 9 is made of a material capable of supplying the hole or electron to two-dimensional material layer 1 by contacting two-dimensional material layer 1. Contact layer 9 allows two-dimensional material layer 1 to be optionally doped with the hole or electron.

For example, a composition containing a photosensitizer having a quinone diazite group and a novolak resin, which is called a positive photoresist, can be used as contact layer 9. For example, a material having a polar group can be used as the material constituting contact layer 9. For example, a material having an electron-withdrawing group, which is an example of the material, has an effect of reducing the electron density of two-dimensional material layer 1. In addition, a material having an electron donating group, which is an example of the material, has an effect of increasing the electron density of two-dimensional material layer 1. Examples of the material having an electron-withdrawing group include materials having a halogen, a nitrile, a carboxyl group, or a carbonyl group. Examples of the material having an electron donating group include materials having an alkyl group, an alcohol, an amino group, or a hydroxyl group. In addition to the above, a material in which charge bias is generated in the entire molecule due to the polar group can also be used as the material of contact layer 9.

In addition, even in an organic substance, a metal, a semiconductor, an insulator, a two-dimensional material, or a mixture of any of these materials, any material can be used as the material of contact layer 9 as long as it is a material in which the charge bias is generated in the molecule to generate the polarity. Here, when contact layer 9 made of an inorganic substance and two-dimensional material layer 1 are brought into contact with each other, the conductivity type with which two-dimensional material layer 1 is doped is the p-type when the work function of contact layer 9 is larger than the work function of two-dimensional material layer 1, and the n-type when the work function of contact layer 9 is smaller than the work function of two-dimensional material layer 1. On the other hand, when contact layer 9 is an organic substance, the organic substance that is a material constituting contact layer 9 does not have the clear work function. Therefore, whether two-dimensional material layer 1 is the n-type doped or the p-type doped is preferably determined by determining the polar group of the material of contact layer 9 based on the polarity of the organic molecule used for contact layer 9.

For example, when a composition called a positive photoresist containing a photosensitizer having a quinone diazite group and a novolak resin is used as contact layer 9, a region where a resist is formed in two-dimensional material layer 1 by a photolithography process is a p-type two-dimensional material layer region. This eliminates the need for processing for forming the mask in contact with the surface of two-dimensional material layer 1. As a result, it is possible to reduce process damage to two-dimensional material layer 1 and simplify the process.

Electromagnetic wave detector 116 further includes contact layer 9 in contact with two-dimensional material layer 1. As described above, for example, using the material having the electron withdrawing group or the material having the electron donating group as the material of contact layer 9, the state (conductivity type) of two-dimensional material layer 1 can be intentionally made the n-type or the p-type. In this case, the carrier doping of two-dimensional material layer t can be controlled without considering the influence of the carrier doping from first electrode portion 5 and semiconductor layer 2. As a result, the performance of the electromagnetic wave detector can be improved.

A gradient of the charge density is formed in two-dimensional material layer 1 by forming contact layer 9 only on one of the side of first electrode portion 5 and the side of semiconductor layer 2 on the upper surface of two-dimensional material layer 1. As a result, the mobility of the carrier in two-dimensional material layer 1 is improved, and the sensitivity of the electromagnetic wave detector can be increased.

The plurality of contact layers 9 may be formed on two-dimensional material layer 1. The number of contact layers 9 may be greater than or equal to three, and may be any number. The plurality of contact layers 9 may be formed on two-dimensional material layer 1 located between first electrode portion 5 and semiconductor layer 2. In this case, the materials of the plurality of contact layers 9 may be the same material or different materials.

In electromagnetic wave detector 116, the film thickness of contact layer 9 is preferably sufficiently thin such that photoelectric conversion can be performed when two-dimensional material layer 1 is irradiated with the electromagnetic wave. On the other hand, contact layer 9 is formed so as to have the thickness that allows the carrier to be doped from contact layer 9 to two-dimensional material layer 1. Contact layer 9 may have any configuration as long as the carrier such as the molecule or the electron is introduced into two-dimensional material layer 1. For example, two-dimensional material layer 1 is immersed in a solution to supply the carrier to two-dimensional material layer 1 at the molecular level, so that the carrier may be doped to two-dimensional material layer 1 without forming solid contact layer 9 on two-dimensional material layer 1.

In addition, as the material of contact layer 9, a material that causes polarity conversion may be used in addition to the above-described materials. In this case, when contact layer 9 performs the polarity conversion, the electron or hole generated during the conversion is supplied to two-dimensional material layer 1. Accordingly, the doping of the electron or hole is generated in the part of two-dimensional material layer 1 with which contact layer 9 is in contact. Accordingly, even when contact layer 9 is removed, the part of two-dimensional material layer 1 in contact with contact layer 9 remains doped with the electron or hole. Consequently, when the material that causes the polarity conversion is used as contact layer 9, contact layer 9 may be removed from two-dimensional material layer 1 after a certain time elapses. In this case, an opening area of two-dimensional material layer 1 increases as compared with the case where contact layer 9 exists. For this reason, the detection sensitivity of the electromagnetic wave detector can be improved. At this point, the polar conversion is a phenomenon in which the polar group is chemically converted, and for example, means a phenomenon in which the electron withdrawing group is changed to the electron donating group, or the electron donating group is changed to the electron withdrawing group, or the polar group is changed to a nonpolar group, or a nonpolar group is changed to the polar group.

In addition, contact layer 9 may be formed of a material that causes the polarity conversion by the electromagnetic wave irradiation. In this case, by selecting the material that causes the polarity conversion at a specific wavelength of the electromagnetic wave as the material of contact layer 9, the polarity conversion can be caused in contact layer 9 only when the electromagnetic wave of the specific wavelength of the electromagnetic wave is irradiated, and doping into two-dimensional material layer 1 can be performed. As a result, the photocurrent flowing into two-dimensional material layer 1 can be increased.

In addition, a material that causes an oxidation-reduction reaction by electromagnetic wave irradiation may be used as the material of contact layer 9. In this case, the electron or hole generated during the oxidation-reduction reaction can be doped in two-dimensional material layer 1.

Electromagnetic wave detector 116 of the sixteenth embodiment may have the same configuration as any of electromagnetic wave detector 101 to electromagnetic wave detector 115 of the second to fifteenth embodiment except that at least one contact layers 9 in contact with two-dimensional material layer 1 are further included.

Seventeenth Embodiment

An electromagnetic wave detector according to a seventeenth embodiment has a configuration basically similar to that of the electromagnetic wave detector of the first embodiment, and exhibits a similar effect, but is different from electromagnetic wave detector 100 in that two-dimensional material layer 1 includes a turbulent layer structure part.

In the electromagnetic wave detector of the seventeenth embodiment, a region corresponding to the channel region in two-dimensional material layer 1 is the turbulent layer structure part. At this point, the turbulent layer structure is a region in which a plurality of graphene layers are laminated, and means a structure in which the laminated graphene layers are laminated while lattices of the laminated graphene layers are mismatched. Entire two-dimensional material layer 1 may have the turbulent layer structure, or only a part thereof may have the turbulent layer structure.

Any method can be used as a method for producing the turbulent layer structure portion. For example, a single-layer graphene prepared by a CVD method may be transferred multiple times, and the multilayer graphene may be laminated to form the turbulent layer structure portion. In addition, the graphene may be grown on the graphene by the CVD method using ethanol, methane, or the like as a carbon source to form the turbulent layer structure portion. When the contact region with insulating layer 4 in two-dimensional material layer 1 has the turbulent layer structure, the carrier mobility in two-dimensional material layer 1 is improved. Here, the normal multilayer graphene is called A-B lamination, and is laminated while lattices of the laminated graphene are matched. However, the graphene produced by the CVD method is polycrystalline, and in the case where the graphene is transferred on the graphene multiple times, or in the case where the graphene is laminated on the underlying graphene by the CVD method, the turbulent layer structure in which the lattices of the laminated graphenes are mismatched is obtained.

The graphene having the turbulent layer structure has little influence of interlayer interaction and has properties equivalent to those of single-layer graphene. Furthermore, the mobility of two-dimensional material layer 1 decreases due to the influence of carrier scattering in underlying insulating layer 4. However, the graphene having the turbulent layer structure in contact with insulating layer 4 is affected by the carrier scattering, but the upper-layer graphene laminated on the graphene in the turbulent layer structure is hardly affected by the carrier scattering of underlying insulating layer 4. In addition, in the graphene having the turbulent layer structure, the influence of the interlayer interaction is small, and thus the conductivity is also improved. As described above, in the graphene having the turbulent layer structure, the carrier mobility can be improved. As a result, the sensitivity of the electromagnetic wave detector can be improved.

In addition, the graphene having the turbulent layer structure may be applied only to a portion of two-dimensional material layer 1 existing on insulating layer 4. For example, for a contact region with semiconductor layer 2 and a contact region with first electrode portion 5 in two-dimensional material layer 1, the graphene that is not the turbulent layer structure, for example, the single-layer graphene may be used. In this case, the influence of the carrier scattering of insulating layer 4 on two-dimensional material layer 1 can be prevented without increasing a contact resistance between first electrode portion 5 and semiconductor layer 2 and two-dimensional material layer 1.

The electromagnetic wave detector of the seventeenth embodiment may have a configuration similar to any of electromagnetic wave detector 101 to electromagnetic wave detector 116 of the second to sixteenth embodiment except that two-dimensional material layer 1 includes the turbulent layer structure part.

Eighteenth Embodiment

An electromagnetic wave detector according to an eighteenth embodiment has a configuration basically similar to that of electromagnetic wave detector 100 of the first embodiment, and exhibits a similar effect. However, the electromagnetic wave detector is different from electromagnetic wave detector 100 in that a material constituting at least one of semiconductor layer 2, insulating layer 4, and contact layer 9 is specified as a material in which the characteristic is changed by the irradiation of the electromagnetic wave to give the change in potential to two-dimensional material layer 1.

The material constituting each of semiconductor layer 2, insulating layer 4, and contact layer 9 may be a material in which the characteristic is changed by the irradiation with the electromagnetic wave to give the change in potential to two-dimensional material layer 1. In addition, only the material constituting any of semiconductor layer 2, insulating layer 4, and contact layer 9 may be a material in which the characteristic is changed by the irradiation with the electromagnetic wave to give the change in potential to two-dimensional material layer 1. In addition, only two constituent materials of semiconductor layer 2, insulating layer 4, and contact layer 9 may be the material in which the characteristic is changed by the irradiation with the electromagnetic wave to give the change in potential to two-dimensional material layer 1.

For example, semiconductor layer 2 is made of at least one selected from the group consisting of a semiconductor material, a pn junction material, a metal-semiconductor junction material, a metal-insulator-semiconductor junction material, and a perovskite material (a material in which the crystal structure is the perovskite structure).

The contact layer 9 includes at least one selected from the group consisting of a quantum dot, a liquid crystal material, fullerene, and a perovskite material.

For example, insulating layer 4 is made of at least one of a ferroelectric material and a rare earth oxide. For example, when the ferroelectric material having the polarization effect (pyroelectric effect) due to the electromagnetic wave is used as the ferroelectric material, the polarization of the ferroelectric material is changed by the electromagnetic wave irradiation. As a result, the change in potential can be applied to two-dimensional material layer 1.

When contact layer 9 is made of a material that gives the change in potential to two-dimensional material layer 1 as described above, contact layer 9 is not necessarily in direct contact with two-dimensional material layer 1. For example, contact layer 9 may be provided so as to be in contact with the upper surface or the lower surface of two-dimensional material layer 1 with the insulating film interposed therebetween.

The electromagnetic wave detector of the eighteenth embodiment may have the same configuration as any of the electromagnetic wave detectors of the second to seventeenth embodiment except that the material constituting at least one of semiconductor layer 2, insulating layer 4, and contact layer 9 is specified as the material in which the characteristic changes by the irradiation of the electromagnetic wave and that gives the change in potential to two-dimensional material layer 1.

Nineteenth Embodiment

Figure 26:
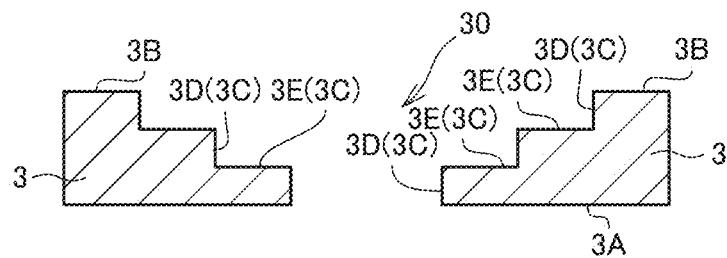
FIG. 26 is a partial sectional view illustrating a plasmon filter of an electromagnetic wave detector according to a nineteenth embodiment.

An electromagnetic wave detector according to a nineteenth embodiment has a configuration basically similar to that of electromagnetic wave detector 100 of the first embodiment, and exhibits a similar effect, but is different from electromagnetic wave detector 100 in that a sectional shape of each inner peripheral surface 3C of the plurality of through-holes 30 is stepwise (step shape). FIG. 26 illustrates only a peripheral structure of one through-hole 30 of plasmon filter 3 of the electromagnetic wave detector of the nineteenth embodiment, and omits illustration of peripheral structures of other through-holes 30 of plasmon filter 3 and other members.

As illustrated in FIG. 26, inner peripheral surface 3C includes a plurality of (for example, two) step surfaces 3D and a plurality of (for example, three) terrace surfaces 3E. For example, each step surface 3D extends along the hole axis of through-hole 30. Each terrace surface 3E intersects with the hole axis of through-hole 30 and has an annular shape in planar view. In planar view, for example, the centers of terrace surfaces 3E overlap with each other. In planar view, for example, the center of each terrace surface 3E overlaps with the center of through-hole 30. For example, each terrace surface 3E is orthogonal to the hole axis of through-hole 30. For example, the dimensions of step surfaces 3D are equal to each other. For example, the dimensions of terrace surfaces 3E are equal to each other. The upper end of step surface 3D (uppermost step surface 3D) located outermost in the radial direction with respect to the center of each through-hole 30 is connected to the inner peripheral end of fourth surface 38. Insulating layer 4 and two-dimensional material layer 1 are disposed on the plurality of step surfaces 3D, the plurality of terrace surfaces 3E, and fourth surface 3B of plasmon filter 3.

At least one of the plurality of through-holes 30 may have the structure in FIG. 26, but for example, each of the plurality of through-holes 30 of plasmon filter 3 has the structure in FIG. 26.

In the electromagnetic wave detector of the nineteenth embodiment, as compared with electromagnetic wave detector 100, high order diffraction is hardly generated in plasmon filter 3 when plasmon filter 3 is irradiated with the electromagnetic wave, so that the intensity of the electromagnetic wave transmitted through plasmon filter 3 can be enhanced.

In the sectional view, each step surface 3D may have a forward tapered shape. In other words, each step surface 3D may be inclined such that the distance from third surface 3A increases as the distance from the center of through-hole 30 increases.

The electromagnetic wave detector of the nineteenth embodiment may have the same configuration as any of the electromagnetic wave detectors of the second to eighteenth embodiment except that the sectional shape of each inner peripheral surface 3C of the plurality of through-holes 30 is stepwise (step shape).

Twentieth Embodiment

Figure 27:
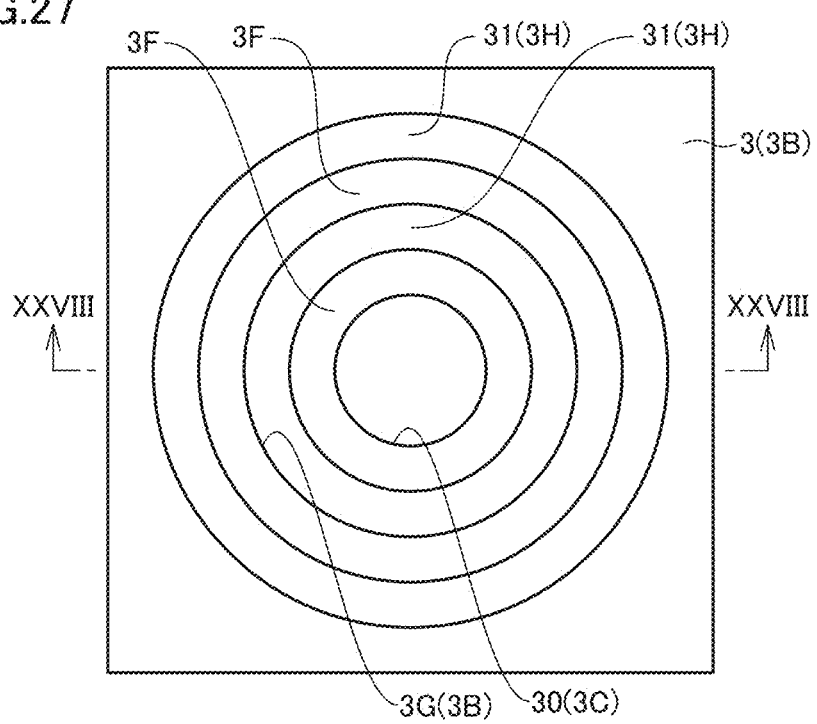
FIG. 27 is a partial plan view of a plasmon filter of an electromagnetic wave detector according to a twentieth embodiment.
Figure 28:
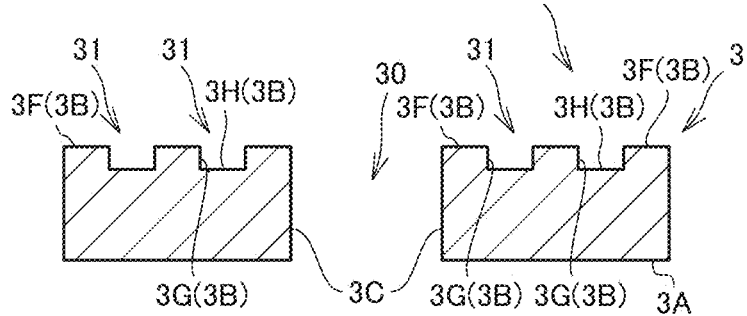
FIG. 28 is a partial sectional view illustrating the plasmon filter viewed from an arrow XXVIII-XXVIII in FIG. 27.

An electromagnetic wave detector according to a twentieth embodiment has a configuration basically similar to that of electromagnetic wave detector 100 of the first embodiment and exhibits a similar effect, but is different from electromagnetic wave detector 100 in that a plurality of grooves 31 (dugs) surrounding one through-hole 30 are formed on fourth surface 313 of plasmon tilter 3. FIGS. 27 and 28 illustrate only a peripheral structure of one through-hole 30 of plasmon filter 3 of the electromagnetic wave detector of the twentieth embodiment, and do not illustrate peripheral structures of other through-holes 30 of plasmon filter 3 and other members.

As illustrated in FIG. 27, centers of the plurality of (for example, two) grooves 31 overlap with each other in planar view. In planar view, for example, the center of each groove 31 overlaps with the center of one through-hole 30. From a different point of view, fourth surface 3B of plasmon filter 3 has what is called a bullseye structure in planar view.

As illustrated in FIG. 28, fourth surface 3B includes a plurality of (for example, three) top surfaces 3F, a plurality of (for example, four) wall surfaces 3G, and a plurality of (for example, two) bottom surfaces 3H. Each groove 31 includes two wall surfaces 3G and one bottom surface 3H. Two wall surfaces 3G of each groove 31 are opposite to each other in the radial direction with respect to the hole axis of through-hole 30. An upper end of each wall surface 3G is connected to an inner peripheral end or an outer peripheral end of each top surface 3F. A lower end of each wall surface 31A is connected to an inner peripheral end or an outer peripheral end of each bottom surface 3H. For example, each wall surface 3G extends along the hole axis of through-hole 30. For example, each of top surfaces 3F and each of bottom surfaces 311 are orthogonal to the hole axis of through-hole 30. The inner peripheral end of top surface 3F located on the innermost side in the radial direction with respect to the center of through-hole 30 is connected to the upper end of inner peripheral surface 3C. Insulating layer 4 and two-dimensional material layer 1 are disposed on the plurality of top surfaces 3F, the plurality of wall surfaces 30, and the plurality of bottom surfaces 3H of plasmon filter 3. For example, first electrode portion 5 is disposed on top surface 3F located on the outermost side in the radial direction with respect to the center of through-hole 30.

In planar view, each groove 31 surrounds only one through-hole 30. In planar view, each groove 31 does not surround two adjacent through-holes 30.

At least one through-hole 30 among the plurality of through-holes 30 may have the structure in FIGS. 27 and 28, but for example, each of the plurality of through-holes 30 has the structure in FIGS. 27 and 28.

In the electromagnetic wave detector of the twentieth embodiment, when the electromagnetic wave is incident on fourth surface 3B on which the groove 31 is formed, the surface plasmon resonance of a propagation type is generated in plasmon filter 3. The surface plasmon resonance propagates through fourth surface 3B where the plurality of grooves 31 are formed and is guided to through-hole 30, the intensity of the electromagnetic wave transmitted through plasmon filter 3 can be enhanced.

Furthermore, in the electromagnetic wave detector of the twentieth embodiment, the detection wavelength is determined by the shapes (the period of the plurality of grooves 31, the dimension of each groove 31, and the like) of the plurality of grooves 31, so that the degree of freedom in setting the detection wavelength is higher than that of electromagnetic wave detector 100 in which the plurality of grooves 31 are not formed.

At least one groove 31 may be formed in plasmon filter 3. The number of grooves 31 may be 1. The number of grooves 31 may be greater than or equal to 3. For example, the interval between two grooves 31 adjacent to each other in the radial direction is equal to each other. In this way, wavelength selectivity (monochromaticity) is enhanced. On the other hand, the intervals between grooves 31 adjacent to each other in the radial direction may be different from each other. In this way, the wavelength band of the electromagnetic wave transmitted through plasmon filter 3 is widened.

In the sectional view, each wall surface 3G may have a forward tapered shape. In other words, each wall surface 3G may be inclined such that the distance from third surface 3A increases as the distance from the center of through-hole 30 increases.

The electromagnetic wave detector of the twentieth embodiment may have the same configuration as any of the electromagnetic wave detectors of the second to nineteenth embodiment except that at least one groove 31 surrounding through-hole 30 is formed on fourth surface 3B of plasmon filter 3.

Twenty-First Embodiment

As illustrated in FIG. 29, an electromagnetic wave detector array 300 according to a twenty-first embodiment is an assembly of a plurality of electromagnetic wave detectors 200. Each electromagnetic wave detector 200 is any one of the electromagnetic wave detectors 100 to 116 of the first to twentieth embodiments.

In electromagnetic wave detector array 300 of FIG. 29, the plurality of electromagnetic wave detectors 200 is two-dimensionally and periodically arranged. The plurality of electromagnetic wave detectors 200 may be periodically arranged one-dimensionally. Furthermore, the plurality of electromagnetic wave detectors 200 may be arranged not periodically but at different intervals.

In electromagnetic wave detector array 300 of FIG. 29, electromagnetic wave detectors 200 are arranged in a 2×2 matrix. However, the number of electromagnetic wave detectors 200 to be arranged is not limited thereto. For example, the plurality of electromagnetic wave detectors 200 may be arranged in a matrix shape of at least 3× at least 3.

In the electromagnetic wave detector array in which the plurality of electromagnetic wave detectors 200 are arranged in an array shape, second electrode portion 6 may be a common electrode as long as two-dimensional material layers 1 of electromagnetic wave detectors 200 are separated from each other. In the electromagnetic wave detector array in which second electrode portion 6 is a common electrode, as compared with the electromagnetic wave detector array in which second electrode portions 6 of respective electromagnetic wave detectors 200 are independent from each other, the number of wiring of pixels can be reduced, and the resolution is increased.

In order to separate electromagnetic wave detectors 200 from each other, a current interrupting structure such as a trench structure of semiconductor layer 2 may be formed.

Electromagnetic wave detector array 300 can also be used as an image sensor by arranging the plurality of electromagnetic wave detectors 200 in an array shape. The detection wavelengths of electromagnetic wave detectors 200 may be the same as each other, and be different from each other.

Furthermore, electromagnetic wave detector array 300 may include a readout circuit configured to read out a signal from each electromagnetic wave detector 200. Each electromagnetic wave detector 200 may be disposed on the readout circuit. For example, a readout format of the readout circuit is a capacitive transimpedance amplifier (CTAI) type. The readout circuit may be in another readout format.

Furthermore, electromagnetic wave detector array 300 may include a bump that electrically connects first electrode portion 5 of each electromagnetic wave detector 200 and the readout circuit. A structure in which each electromagnetic wave detector 200 and the readout circuit are connected to each other by a bump is called a hybrid junction. The hybrid junction is a general structure in a quantum infrared sensor. In this case, for example, each electromagnetic wave detector 200 further includes a pad electrically connected to first electrode portion 5, and each bump is electrically connected to the pad. For example, the material of the bump is a conductive material such as indium (In). The material of the pad is a conductive material such as aluminum silicon (Al—Si)-based alloy, nickel (Ni), or gold (Au).

<Modification>

An electromagnetic wave detector array 301 in FIG. 30 has a configuration basically similar to that of electromagnetic wave detector array 300 and exhibits a similar effect, but is different from electromagnetic wave detector array 300 in that electromagnetic wave detectors 200, 201, 202, 203 of different types are provided as the plurality of electromagnetic wave detectors. Each of electromagnetic wave detectors 200, 201, 202, 203 is any one of electromagnetic wave detectors 100 to 116 according to the first to twentieth embodiments.

In electromagnetic wave detector array 301, electromagnetic wave detectors 200, 201, 202, 203 of different types are arranged in a matrix shape.

In FIG. 30, electromagnetic wave detectors 200, 201, 202, 203 are arranged in a 2×2 matrix, but the number of electromagnetic wave detectors to be arranged is not limited thereto. In the present embodiment, electromagnetic wave detectors 200, 201, 202, 203 of different types are periodically and two-dimensionally arrayed, but may be periodically and one-dimensionally arrayed. Furthermore, electromagnetic wave detectors 200, 201, 202, 203 of different types may be arranged not periodically but at different intervals.

In electromagnetic wave detector assembly 301, different types of electromagnetic wave detectors 200, 201, 202, 203 according to any one of the first to twentieth embodiments are arranged in the one-dimensional or two-dimensional array, so that a function as an image sensor can be provided. For example, the electromagnetic wave detectors having different detection wavelengths may be used as electromagnetic wave detectors 200, 201, 202, 203. Specifically, the electromagnetic wave detectors having different detection wavelength selectivities may be prepared from the electromagnetic wave detector according to any one of the first to twentieth embodiments, and arranged in an array. In this case, the electromagnetic wave detector assembly can detect the electromagnetic waves of at least two different wavelengths.

When electromagnetic wave detectors 200, 201, 202, 203 having different detection wavelengths are arrayed in this manner, the wavelength of the electromagnetic wave can be identified in an arbitrary wavelength region such as a wavelength region of ultraviolet light, infrared light, a terahertz wave, or a radio wave, similarly to the image sensor used in the visible light region. As a result, for example, a colored image in which a difference in wavelength is indicated as a difference in color can be obtained.

Each of semiconductor layers 2 of electromagnetic wave detectors 200, 201, 202, 203 may be made of materials having different detection wavelengths. For example, the semiconductor material in which the detection wavelength is a wavelength of visible light and the semiconductor material in which the detection wavelength is a wavelength of infrared light may be used as the above constituent material. In this case, for example, when the electromagnetic wave detector is applied to an in-vehicle sensor, the electromagnetic wave detector can be used as a visible light image camera in the daytime. Furthermore, the electromagnetic wave detector can also be used as an infrared camera at night. In this way, the camera having the image sensor is not required to be selectively used depending on the detection wavelength of the electromagnetic wave.

As an application of the electromagnetic wave detector other than the image sensor, for example, the electromagnetic wave detector can be used as a position detecting sensor capable of detecting the position of the object even with a small number of pixels. For example, the image sensor that detects intensity of the electromagnetic waves having the plurality of wavelengths can be obtained using electromagnetic wave detectors 200, 201, 202, 203 having different detection wavelengths as described above due to the structure of the electromagnetic wave detector assembly. Thus, the electromagnetic waves of the plurality of wavelengths can be detected to obtain the color image without using a color filter conventionally required in a CMOS image sensor or the like.

Furthermore, a polarization identification image sensor can also be formed by arraying electromagnetic wave detectors 200, 201, 202, 203 having different polarizations to be detected. For example, the polarization imaging can be performed by arranging a plurality of electromagnetic wave detectors in one portion of four pixels in which detected polarization angles are 0°, 90°, 45°, 135°. For example, the polarization identification image sensor enables identification of an artifact and a natural object, material identification, identification of an object having the same temperature in an infrared wavelength range, identification of a boundary between objects, or improvement of equivalent resolution.

As described above, the electromagnetic wave detector assembly according to the eighteenth embodiment configured as described above can detect the electromagnetic wave in the wide wavelength range. Furthermore, the electromagnetic wave detector assembly according to the eighteenth embodiment can detect the electromagnetic waves of different wavelengths.

It should be considered that the disclosed embodiments are an example in all respects and not restrictive. As long as there is no contradiction, at least two of the disclosed embodiments may be combined. The scope of the present disclosure is defined by not the above description but the claims, and it is intended that all modifications within the meaning and scope of the claims are included in the present invention.

REFERENCE SIGNS LIST

1: two-dimensional material layer, 1a: first part, 1b: second part, 1c: third part, 2: semiconductor layer, 2A: first surface, 2B: second surface, 3: plasmon filter, 3A: third surface, 33: fourth surface, 3C: inner peripheral surface, 4: insulating layer, 4C: inclined surface, 4a, 4b: part, 5: first electrode portion, 6: second electrode portion, 7: buffer layer, 8: connection conductor, 9: contact layer, 10: first member, 11: second member, 20: region, 21: first semiconductor part, 22: second semiconductor part, 23: junction interface, 24: protrusion, 30: through-hole, 100, 101, 102, 103, 104, 105, 106, wave detector, 300, 301: electromagnetic wave detector array

The invention claimed is:
1. An electromagnetic wave detector comprising:
at least one photoelectric conversion element; and
a plasmon filter disposed so as to be opposite to the at least one photoelectric conversion element,
wherein a plurality of through-holes are periodically made in the plasmon filter, and
the at least one photoelectric conversion element includes:
a semiconductor layer including a region overlapping with at least one through-hole in the plurality of through-holes in a planar view;
an insulating layer formed so as to cover a part of the region;
a two-dimensional material layer that is disposed on an other part of the region and the insulating layer and electrically connected to the other part of the region;
a first electrode portion electrically connected to the two-dimensional material layer; and
a second electrode portion electrically connected to the semiconductor layer.
2. The electromagnetic wave detector according to claim 1, wherein
in the at least one photoelectric conversion element,
the semiconductor layer includes a plurality of regions overlapping with each of at least two through-holes in the plurality of through-holes in planar view, and
the two-dimensional material layer is electrically connected to the other part of each of the plurality of regions.
3. The electromagnetic wave detector according to claim 1,
wherein the plasmon filter is disposed on an identical side as the insulating layer, the two-dimensional material layer, and the first electrode portion with respect to the semiconductor layer, the insulating layer extends from a part of the region to a part of the plasmon filter, the two-dimensional material layer extends from the other part of the region onto the insulating layer disposed on the plasmon filter, and the first electrode portion is disposed on the insulating layer disposed on the plasmon filter.

4. The electromagnetic wave detector according to claim 1, wherein the plasmon filter is disposed on a side opposite to the insulating layer, the two-dimensional material layer, and the first electrode portion with respect to the semiconductor layer.

5. The electromagnetic wave detector according to claim 1, wherein a material constituting at least a part of a surface of the plasmon filter is a material that causes surface plasmon resonance when an electromagnetic wave is incident.

6. The electromagnetic wave detector according to claim 5, wherein
the plasmon filter includes a core material and a packaging material disposed on at least a part of a surface of the core material, and
a material constituting the packaging material is the material that causes the surface plasmon resonance when the electromagnetic wave is incident.

7. The electromagnetic wave detector according to claim 5, wherein
the plasmon filter includes a first member and a second member that are laminated along a hole axis direction of each of the plurality of through-holes,
the material constituting the first member is the material that causes the surface plasmon resonance when the electromagnetic wave is incident, and
a material constituting the second member is a dielectric.

8. The electromagnetic wave detector according to claim 1, wherein a wavelength band in which a surface plasmon is excited in the plasmon filter is narrower than a wavelength band in which the semiconductor layer has sensitivity.

9. The electromagnetic wave detector according to claim 1, wherein the plurality of through-holes is periodically arranged along at least one direction.

10. The electromagnetic wave detector according to claim 9, wherein
the semiconductor layer has sensitivity to a detection wavelength, and
a period of the plurality of through-holes is equal to the detection wavelength.

11. The electromagnetic wave detector according to claim 1, wherein each inner peripheral surface of the plurality of through-holes is inclined with respect to each hole axis of the plurality of through-holes.

12. The electromagnetic wave detector according to claim 1, wherein a sectional shape of each inner peripheral surface of the plurality of through-holes is a step shape.

13. The electromagnetic wave detector according to claim 1, wherein at least one groove surrounding one through-hole of the plurality of through-holes is formed on the surface of the plasmon filter in planar view.

14. The electromagnetic wave detector according to claim 1, wherein an end of the two-dimensional material layer is disposed on the region.

15. The electromagnetic wave detector according to claim 1, further comprising a buffer layer disposed between the region of the semiconductor layer and the two-dimensional material layer.

16. The electromagnetic wave detector according to claim 15, wherein the buffer layer has a thickness capable of forming a tunneling current between the two-dimensional material layer and the semiconductor layer.

17. The electromagnetic wave detector according to claim 1, further comprising a connection conductor to electrically connect the region of the semiconductor layer and the two-dimensional material layer.

18. The electromagnetic wave detector according to claim 1, wherein
the semiconductor layer includes:
a first semiconductor part having a first conductivity type; and
a second semiconductor part joined to the first semiconductor part and having a second conductivity type, and
a junction interface between the first semiconductor part and the second semiconductor part is disposed in the region.

19. The electromagnetic wave detector according to claim 18, wherein an absorption wavelength of the first semiconductor part is different from an absorption wavelength of the second semiconductor part.

20. The electromagnetic wave detector according to claim 1, wherein the first electrode portion is formed in an annular shape in planar view, and the region is disposed inside the first electrode portion.

21. The electromagnetic wave detector according to claim 1, wherein a thickness of the insulating layer changes from the region toward the first electrode portion.

22. The electromagnetic wave detector according to claim 1, wherein a gap is formed between the semiconductor layer and the two-dimensional material layer.

23. The electromagnetic wave detector according to claim 1, further comprising a contact layer disposed so as to contact with the two-dimensional material layer.

24. The electromagnetic wave detector according to claim 1, wherein the two-dimensional material layer includes any material selected from a group consisting of transition metal di-chalcogenide, graphene, black phosphorus, silicene, germanene, graphene nanoribbons, and borophene.

25. The electromagnetic wave detector according to claim 1, wherein the two-dimensional material layer includes a turbostratic part, and
the turbostratic part is disposed on at least the insulating layer.

26. An electromagnetic wave detector array comprising a plurality of the electromagnetic wave detectors according to claim 1,
wherein the plurality of electromagnetic wave detectors are arranged side by side along at least one of a first direction and a second direction.

* * * * *